(12) United States Patent
Ahn et al.

(10) Patent No.: US 12,052,836 B2
(45) Date of Patent: Jul. 30, 2024

(54) ROLLABLE DISPLAY DEVICE

(71) Applicant: Samsung Display Co., LTD., Yongin-si (KR)

(72) Inventors: Jae Ho Ahn, Asan-si (KR); Beom Jin Kim, Asan-si (KR); Tae Woong Kim, Seongnam-si (KR); Sang Jun Lee, Hwaseong-si (KR); Jin Hwan Choi, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 146 days.

(21) Appl. No.: 17/902,412

(22) Filed: Sep. 2, 2022

(65) Prior Publication Data

US 2023/0232553 A1 Jul. 20, 2023

(30) Foreign Application Priority Data

Jan. 17, 2022 (KR) .......................... 10-2022-0006793

(51) Int. Cl.
*H05K 5/02* (2006.01)
(52) U.S. Cl.
CPC .................................. *H05K 5/0217* (2013.01)
(58) Field of Classification Search
CPC .... H05K 5/0217; H05K 5/0017; H05K 1/028; H05K 5/03; H05K 7/1427; H05K 2201/051; G09F 9/301; G09F 15/0062
See application file for complete search history.

(56) References Cited

U.S. PATENT DOCUMENTS

| 8,763,291 | B1 | 7/2014 | Nichols |
| 2008/0005945 | A1* | 1/2008 | Fritsche ................. G09F 17/00 40/603 |
| 2008/0013292 | A1* | 1/2008 | Slikkerveer ........... G06F 1/1601 361/749 |
| 2010/0064564 | A1* | 3/2010 | Bemelmans .......... G06F 1/1601 40/607.01 |

(Continued)

FOREIGN PATENT DOCUMENTS

| CN | 110580859 A | 12/2019 |
| KR | 20170139733 A | 12/2017 |

(Continued)

*Primary Examiner* — Michael P McFadden
(74) *Attorney, Agent, or Firm* — CANTOR COLBURN LLP

(57) ABSTRACT

A display device includes: a first module including a first housing and a first roller portion; a plurality of support portions having first end portions fixed to the first roller portion and extending in a first direction; a display panel disposed to overlap the support portions and including a first surface and a second surface opposite to the first surface; and a second module including a second housing to which second end portions of the support portions are fixed. The support portions are disposed on the second surface, the support portions include a first support portion, and a second support portion spaced apart from the first support portion in a second direction intersecting the first direction, the first support portion includes a concave pattern concave in a direction facing the second surface, and the second support portion includes a convex pattern convex in the direction facing the second surface.

20 Claims, 35 Drawing Sheets

(56) References Cited

U.S. PATENT DOCUMENTS

| | | | | |
|---|---|---|---|---|
| 2010/0139135 A1* | 6/2010 | Taylor | ................ | G09F 15/0025 |
| | | | | 40/607.1 |
| 2015/0378391 A1* | 12/2015 | Huitema | ................ | H05K 1/183 |
| | | | | 361/679.03 |
| 2016/0037657 A1* | 2/2016 | Yoshizumi | ................ | G09F 9/35 |
| | | | | 361/679.01 |
| 2017/0311461 A1* | 10/2017 | Yang | ................ | H05K 5/0217 |
| 2018/0210266 A1* | 7/2018 | Lius | ................ | H01L 29/0653 |
| 2019/0172377 A1 | 6/2019 | Kim et al. | | |
| 2020/0008308 A1* | 1/2020 | Shin | ................ | H05K 5/0017 |

FOREIGN PATENT DOCUMENTS

| | | |
|---|---|---|
| KR | 1020170136060 | 12/2017 |
| KR | 1020200034277 | 3/2020 |
| KR | 1020200070899 | 6/2020 |
| WO | 2021135386 A1 | 8/2012 |

* cited by examiner

360: 310_1, 350_1

ROLLABLE DISPLAY DEVICE

This application claims priority to Korean Patent Application No. 10-2022-0006793, filed on Jan. 17, 2022, and all the benefits accruing therefrom under 35 U.S.C. § 119, the content of which in its entirety is herein incorporated by reference.

BACKGROUND

1. Technical Field

The present disclosure relates to a rollable display device.

2. Description of the Related Art

With the development of information technology, the market for display devices, which is a connection medium between users and information, is growing. Accordingly, the use of display devices such as an organic light emitting diode display ("OLED") and a liquid crystal display ("LCD") is increasing.

Among the display devices, since the organic light emitting diode display is a self-light emitting device, it consumes less power and may be made thinner than the liquid crystal display that requires a backlight. In addition, the organic light emitting diode display has an advantage in that a viewing angle is wide and a response speed is fast.

A flexible display device has been commercialized. The flexible display device may reproduce an input image on a screen of a display panel on which a plastic OLED is formed. The plastic OLED is formed on a flexible plastic substrate. The flexible display device may implement various designs and has advantages in portability and durability. The flexible display device may be implemented as various types of display devices, such as a bendable display device, a foldable display device, and a rollable display device. Such a flexible display device may be applied not only to mobile devices such as smart phones and tablet PCs, but also to televisions ("TVs"), automobile display devices, wearable devices, and the like, and a field of application thereof is expanding.

SUMMARY

In the rollable display device, the display panel may be wound, and the display panel may be used by being unrolled. When the user intends to use the display panel, the display panel is desirable to be maintained in an unrolled state. The conventional rollable display device does not include a fixing mechanism for maintaining the display panel in the unrolled state, so that the display panel may be wound during use, contrary to the user's intention. The absence of such a mechanism has a problem that may reduce the user's convenience of use.

Aspects of the present disclosure provide a display device capable of improving a drooping phenomenon of the display device in a state in which the display device is unrolled in a horizontal direction with respect to the ground.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, a display device includes: a first module including a first housing and a first roller portion disposed in the first housing; a plurality of support portions having first end portions fixed to the first roller portion in the first housing and extending in a first direction; a display panel disposed to overlap the plurality of support portions and including a first surface and a second surface opposite to the first surface; and a second module including a second housing to which second end portions of the plurality of support portions are fixed, where the second end portions are opposite to the first end portions. The plurality of support portions is disposed on the second surface of the display panel, the plurality of support portions includes a first support portion, and a second support portion spaced apart from the first support portion in a second direction intersecting the first direction, the first support portion includes a concave pattern which is concave in a direction facing the second surface of the display panel, and the second support portion includes a convex pattern which is convex in the direction facing the second surface of the display panel.

According to an aspect of the present disclosure, there is provided a display device, the display device includes: a first module including a first housing and a first roller portion disposed in the first housing, where a display panel is configured to be wound around the first roller portion or unwound from the first roller portion; a second module including a second housing and a second roller portion disposed in the second housing, where the second module moves away from the first module when the display panel is unwound; a plurality of support portions having first end portions fixed to the second roller portion and extending in a first direction and having second end portions fixed to the first housing; and the display panel disposed to overlap the plurality of support portions and including a first surface and a second surface opposite to the first surface. The plurality of support portions is disposed on the second surface of the display panel, the plurality of support portions includes a first support portion, and a second support portion spaced apart from the first support portion in a second direction intersecting the first direction, the first support portion includes a concave pattern which is concave in a direction facing the second surface of the display panel, and the second support portion includes a convex pattern which is convex in the direction facing the second surface of the display panel.

Details of other embodiments are included in the detailed description and drawings.

According to the display device according to the embodiment, the drooping phenomenon may be reduced in a state in which the display device is unrolled in the horizontal direction with respect to the ground.

However, the effects of the embodiments are not restricted to the one set forth herein. The above and other effects of the embodiments will become more apparent to one of daily skill in the art to which the embodiments pertain by referencing the claims.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION

Figure 1:
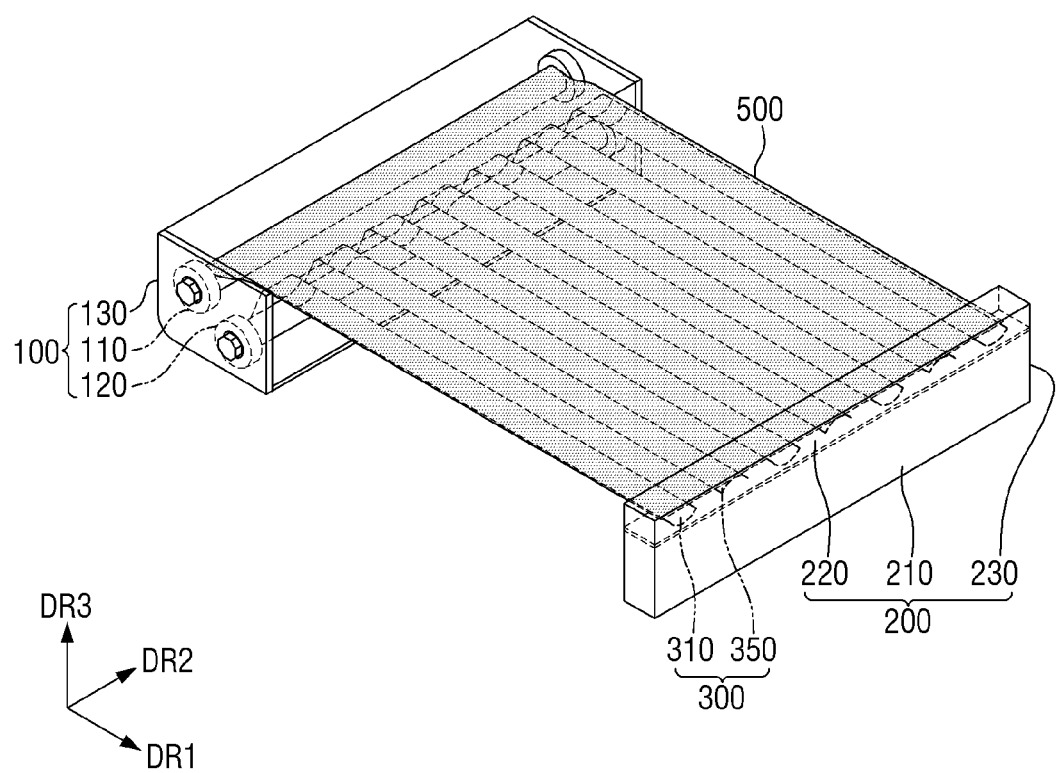
FIG. 1 is a perspective view of a display device according to an embodiment.

Specific structural and functional descriptions of embodiments of the invention disclosed herein are only for illustrative purposes of the embodiments of the invention. The invention may be embodied in many different forms without departing from the spirit and significant characteristics of the invention. Therefore, the embodiments of the invention are disclosed only for illustrative purposes and should not be construed as limiting the invention. That is, the invention is only defined by the scope of the claims.

It will be understood that when an element is referred to as being related to another element such as being "coupled" or "connected" to another element, it can be directly coupled or connected to the other element or intervening elements may be present therebetween. In contrast, it should be understood that when an element is referred to as being related to another element such as being "directly coupled" or "directly connected" to another element, there are no intervening elements present. Other expressions that explain the relationship between elements, such as "between," "directly between," "adjacent to," or "directly adjacent to," should be construed in the same way.

Throughout the specification, the same reference numerals will refer to the same or like parts.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described with reference to the attached drawings.

Figure 2:
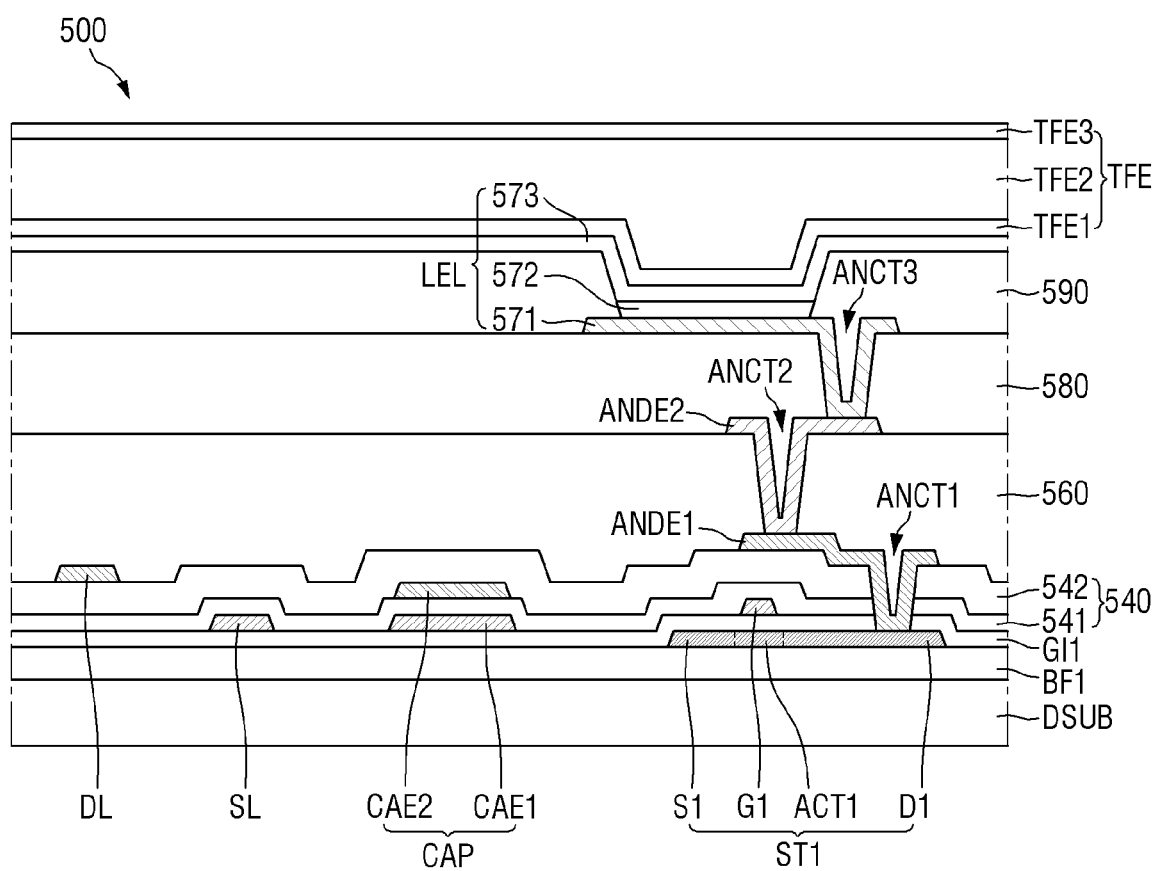
FIG. 2 is a cross-sectional view of a display panel of FIG. 1.
Figure 3:
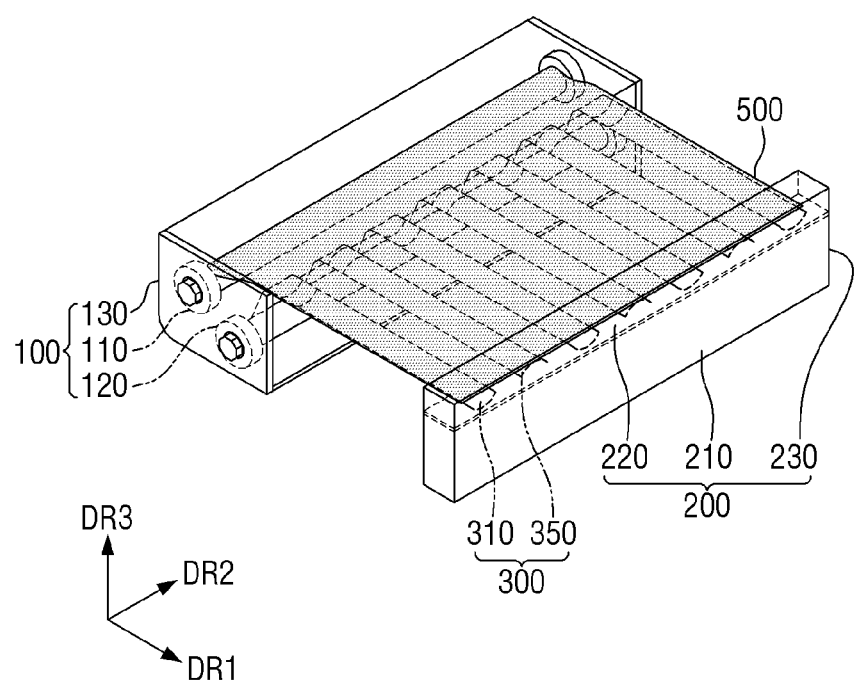
FIG. 3 is a perspective view illustrating an operation of the display device of FIG. 1.
Figure 4:
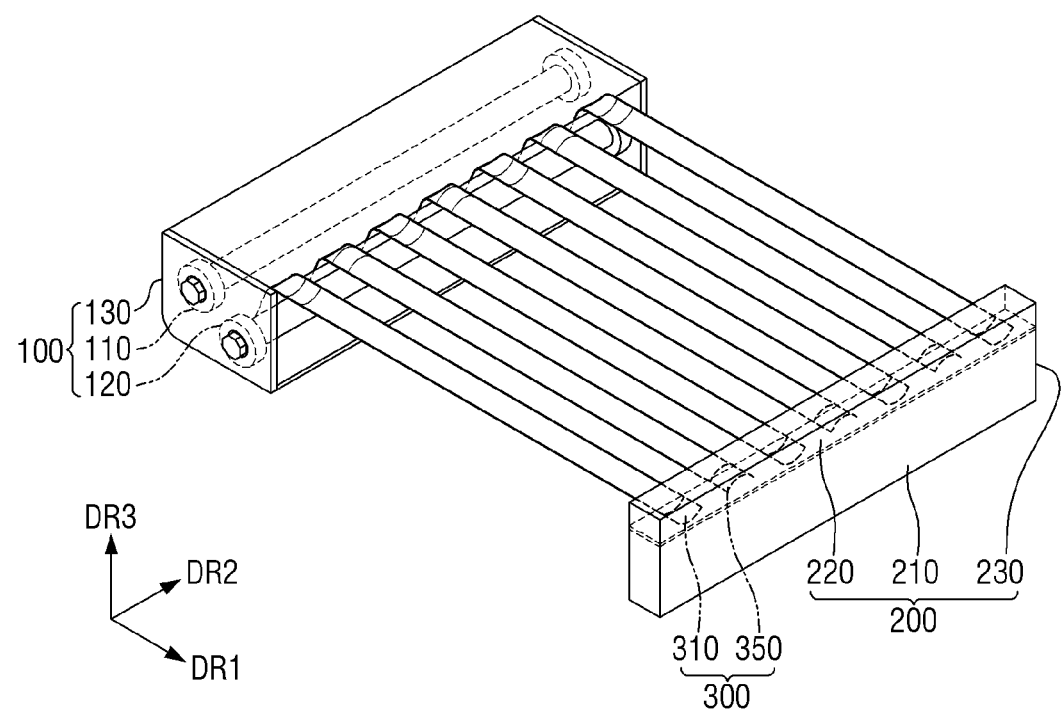
FIG. 4 is a perspective view illustrating a first module, a second module, and a support portion of the display device of FIG. 1.
Figure 5:
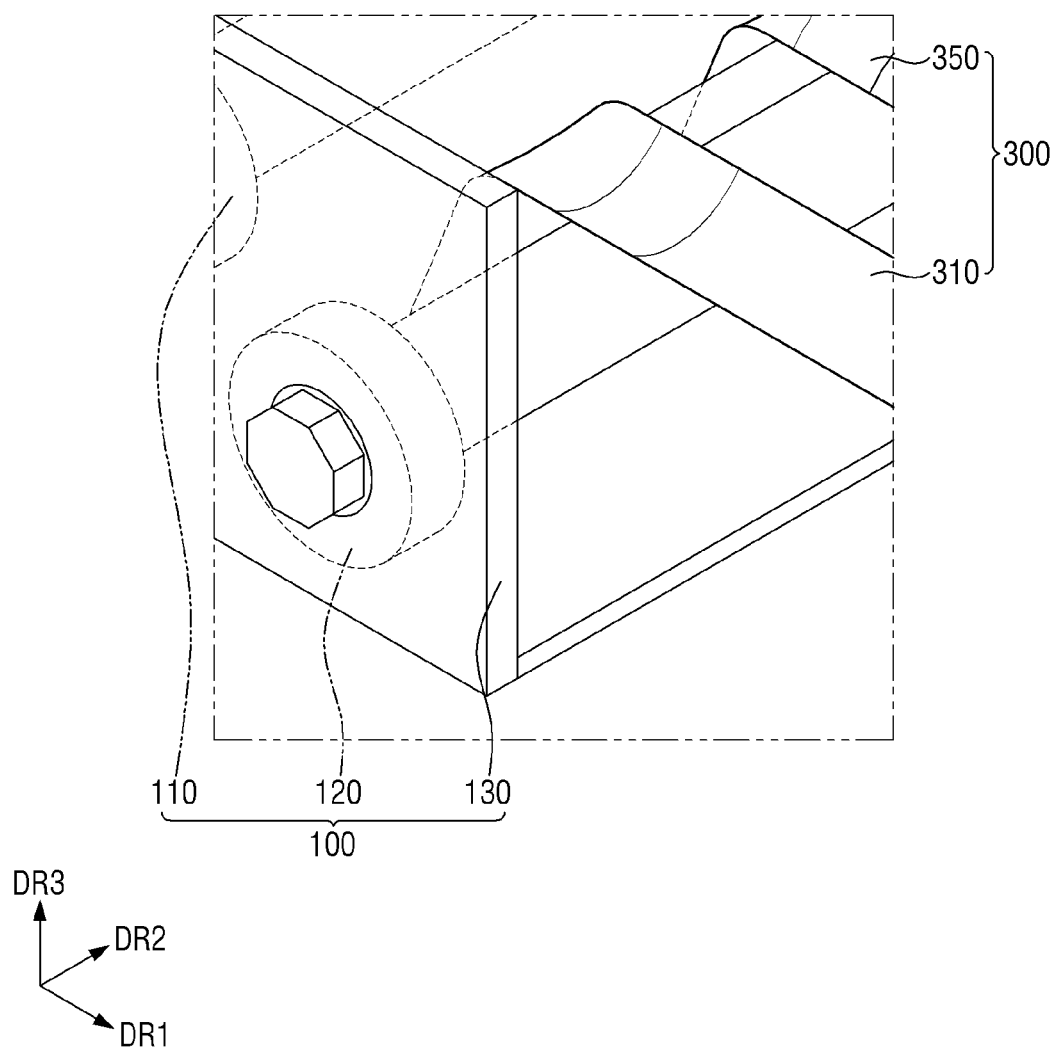
FIG. 5 is a perspective view illustrating in detail the first module and the support portion of FIG. 4.
Figure 6:
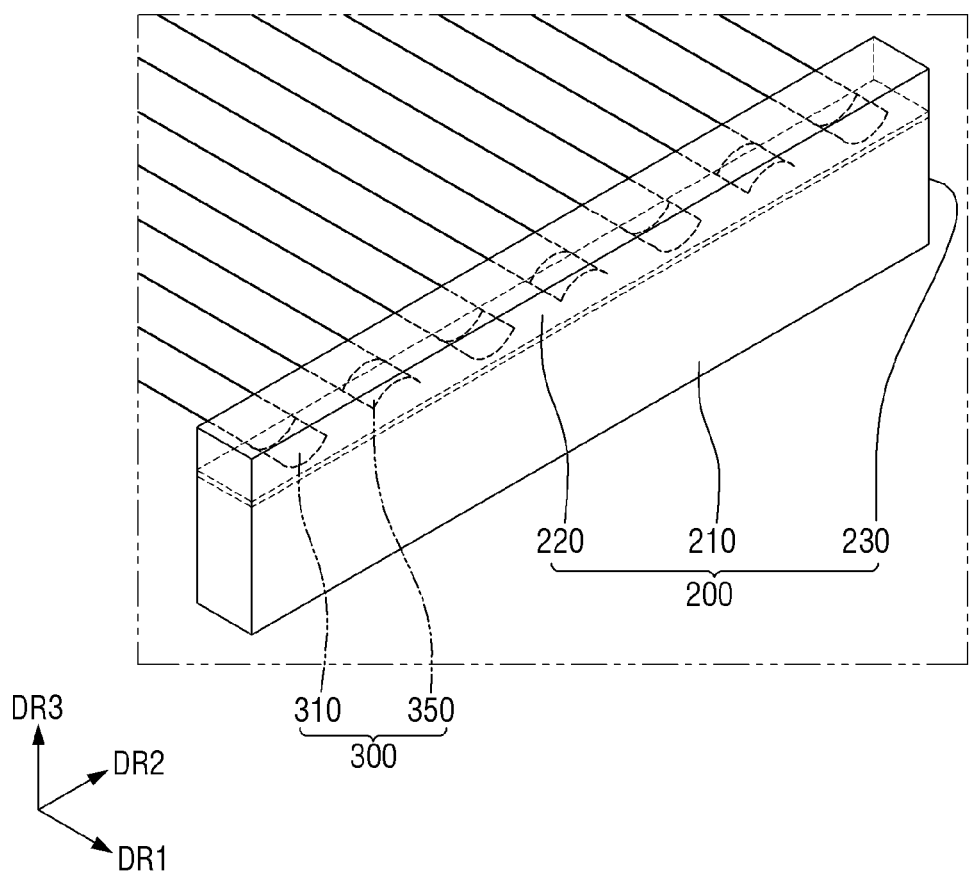
FIG. 6 is a perspective view illustrating in detail the second module and the support portion of FIG. 4.

FIG. 1 is a perspective view of a display device according to an embodiment. FIG. 2 is a cross-sectional view of a display panel of FIG. 1. FIG. 3 is a perspective view illustrating an operation of the display device of FIG. 1. FIG. 4 is a perspective view illustrating a first module, a second module, and a support portion of the display device of FIG. 1. FIG. 5 is a perspective view illustrating in detail the first module and the support portion of FIG. 4. FIG. 6 is a perspective view illustrating in detail the second module and the support portion of FIG. 4.

Referring to FIGS. 1 to 6, a display device according to an embodiment may include a first module 100, a second module 200 spaced apart from the first module 100, a support portion 300, and a display panel 500. The first module 100 and the second module 200 may be spaced apart from each other in a first direction DR1. Each of the first module 100 and the second module 200 may extend along a second direction DR2 crossing the first direction DR1. The first direction DR1 and the second direction DR2 may be located on the same plane. In the present specification, a plane formed by the first direction DR1 and the second direction DR2 is referred to as a first plane, and a third direction DR3 is defined as a direction perpendicular to the first plane.

The display panel 500 may include a liquid crystal display panel, an organic light emitting diode display panel, an inorganic light emitting diode display panel, or a quantum dot display panel. Hereinafter, for convenience of description, a case in which the display panel 500 is an organic light emitting diode display panel will be mainly described.

The display panel 500 may be wound or unwound. That is, a predetermined flexibility is provided to the display panel 500, so that a rolling (or winding) or unrolling (or unwinding) operation may be easily and repeatedly performed.

The first module 100 may include a first housing 130 and a first roller portion 120 disposed in the first housing 130. A plurality of support portions 300 may be provided. The plurality of support portions 300 may include a first support portion 310 and a second support portion 350. The first support portion 310 and the second support portion 350 may be spaced apart from each other in the second direction DR2. The first support portion 310 and the second support portion 350 may be alternately and repeatedly arranged along the second direction DR2.

Each of the plurality of support portions 300 may have one end portion fixed to the first roller portion 120 in the first housing 130 and may extend in the first direction DR1. One end portion of the display panel 500 may be fixed to a second roller portion 110 to be described later. However, the present disclosure is not limited thereto, and in another embodiment, the one end portion of the support portion 300 may not be directly fixed to the first roller portion 120, but may be indirectly fixed to the first roller portion 120 by a separate fastening element.

In some embodiments, the first module 100 may not include the first roller portion 120, and the second module 200 may include the first roller portion 120.

The display panel 500 may be disposed to overlap the plurality of support portions 300. The display panel 500 may include one surface and the other surface opposite to the one surface. The one surface (i.e., top surface) of the display panel 500 may be a display surface which displays an image and face upward (in the third direction DR3). An exemplary stacked structure of the display panel 500 is illustrated in FIG. 2.

As illustrated in FIG. 2, the display panel 500 may include display pixels that display an image. Each of the display pixels may include a light emitting element LEL, a first thin film transistor ST1, and a capacitor CAP.

A display substrate DSUB may be made of an insulating material such as glass or a polymer resin. For example, the display substrate DSUB may include polyimide. The display substrate DSUB may be a flexible substrate that may be bent, folded, and rolled.

The display substrate DSUB may include, for example, a plurality of organic layers and a plurality of inorganic layers. For example, the display substrate DSUB may include a first organic layer, a first barrier layer disposed on the first organic layer and including at least one inorganic layer, a second organic layer disposed on the first barrier layer, and a second barrier layer disposed on the second organic layer and including at least one inorganic layer.

A first buffer layer BF1 may be disposed on the display substrate DSUB. The first buffer layer BF1 is a layer for protecting the first thin film transistor ST1 and a light emitting layer 572 of the light emitting element LEL from moisture permeating through the display substrate DSUB, which is vulnerable to moisture permeation. A first buffer layer BF1 may include a plurality of inorganic layers.

A first active layer ACT1, a first source electrode Si, and a first drain electrode D1 of the first thin film transistor ST1 may be disposed on the first buffer layer BF1. The first active layer ACT1 of the first thin film transistor ST1 includes polycrystalline silicon, single crystal silicon, low-temperature polycrystalline silicon, amorphous silicon, or an oxide semiconductor. The first active layer ACT1 may overlap a first gate electrode G1 in a third direction DR3 that is a thickness direction of the display substrate DSUB.

A first gate insulating layer Gil may be disposed on the first active layer ACT1 of the first thin film transistor ST1. The first gate insulating layer GI1 may be formed of an inorganic layer, for example, a silicon nitride layer, a silicon oxynitride layer, a silicon oxide layer, a titanium oxide layer, or an aluminum oxide layer.

A first gate electrode G1 of the first thin film transistor ST1, a first capacitor electrode CAE1, and a scan line SL may be disposed on the first gate insulating layer GI1. The scan line SL may be electrically connected to the first gate electrode G1. The first capacitor electrode CAE1 may overlap a second capacitor electrode CAE2 in the third direction DR3 (i.e., in a plan view).

A first interlayer insulating layer 541 may be disposed on the first gate electrode G1 and the first capacitor electrode CAE1. The first interlayer insulating layer 541 may include an inorganic layer.

The second capacitor electrode CAE2 may be disposed on the first interlayer insulating layer 541. Since the first interlayer insulating layer 541 has a predetermined dielectric constant, a capacitor CAP may be formed by the first capacitor electrode CAE1, the second capacitor electrode CAE2, and the first interlayer insulating layer 541 disposed between the first capacitor electrode CAE1 and the second capacitor electrode CAE2.

A second interlayer insulating layer 542 may be disposed on the second capacitor electrode CAE2. The second interlayer insulating layer 542 may include an inorganic layer.

A first pixel connection electrode ANDE1 and a data line DL may be disposed on the second interlayer insulating layer 542. The first pixel connection electrode ANDE1 may be connected to the first drain electrode D1 of the first thin film transistor ST1 through a first pixel contact hole ANCT1 penetrating through the first interlayer insulating layer 541 and the second interlayer insulating layer 542 to expose the first drain electrode D1 of the first thin film transistor ST1.

A first organic layer 560 for planarization may be disposed on the first pixel connection electrode ANDE1. The first organic layer 560 may be formed of an acrylic resin, an epoxy resin, a phenolic resin, a polyamide resin, a polyimide resin, or the like.

A second pixel connection electrode ANDE2 may be disposed on the first organic layer 560. The second pixel connection electrode ANDE2 may be connected to the first pixel connection electrode ANDE1 through a second pixel contact hole ANCT2 penetrating through the first organic layer 560 to expose the first pixel connection electrode ANDE1.

A second organic layer 580 may be disposed on the second pixel connection electrode ANDE2. The second organic layer 580 may be formed of an acrylic resin, an epoxy resin, a phenolic resin, a polyamide resin, a polyimide resin, or the like.

It has been illustrated that the first thin film transistor ST1 is formed in a top gate type in which the first gate electrode G1 is positioned above the first active layer ACT1, but it should be noted that the present disclosure is not limited thereto.

Light emitting elements LEL and a bank 590 may be disposed on the second organic layer 580. Each of the light emitting elements LEL includes a light emitting pixel electrode 571, a light emitting layer 572, and a light emitting common electrode 573.

The light emitting pixel electrode 571 may be formed on the second organic layer 580. The light emitting pixel electrode 571 may be connected to the second pixel connection electrode ANDE2 through a third pixel contact hole ANCT3 penetrating through the second organic layer 580 to expose the second pixel connection electrode ANDE2.

In a top emission structure that emits light in a direction of the light emitting common electrode 573 based on the light emitting layer 572, the light emitting pixel electrode 571 may include, for example, a stacked structure (ITO/Ag/ITO) of silver and ITO. However, the present disclosure is not limited thereto.

The bank 590 may be formed to partition the light emitting pixel electrode 571 on the second organic layer 580 to define an emission area EA.

The emission area EA represents an area in which the light emitting pixel electrode 571, the light emitting layer 572, and the light emitting common electrode 573 are sequentially stacked, and holes from the light emitting pixel electrode 571 and electrons from the light emitting common electrode 573 are combined with each other in the light emitting layer 572 to emit light.

The light emitting layer 572 is formed on the light emitting pixel electrode 571 and the bank 590. The light emitting layer 572 may include an organic material to emit light of a predetermined color.

The light emitting common electrode 573 is formed on the light emitting layer 572. The light emitting common electrode 573 may be formed to cover the light emitting layer 572. The light emitting common electrode 573 may be a common layer commonly formed in all the emission areas EA. A capping layer may be formed on the light emitting common electrode 573.

In the top emission structure, the light emitting common electrode 573 may be formed of transparent conductive oxide ("SCE") such as ITO or indium zinc oxide ("IZO") capable of transmitting light, or a semi-transmissive conductive material such as magnesium (Mg), silver (Ag), or an alloy of magnesium (Mg) and silver (Ag).

An encapsulation layer TFE may be disposed on the light emitting common electrode 573. The encapsulation layer TFE may include at least one inorganic layer to prevent oxygen or moisture from permeating into the light emitting element layer EML. In addition, the encapsulation layer TFE may include at least one organic layer and at least one inorganic layer in order to protect the light emitting element layer EML from foreign materials such as dust. For example, the encapsulation layer TFE may include a first encapsulation inorganic layer TFE1, an encapsulation organic layer TFE2, and a second encapsulation inorganic layer TFE3.

Referring to FIG. 1, the second module 200 may include a second housing 230 to which the other end portion of the support portion 300 is fixed. The second module 200 may further include a frame 220 and a battery 210 disposed in the second housing 230. The other end portion of the support portion 300 and the other end portion of the display panel 500 may be fixed to the frame 220. However, the present disclosure is not limited thereto, and in another embodiment, the other end portion of the support portion 300 may not be directly fixed to the frame 220, but may be indirectly fixed to the frame 220 by a separate fastening element. The battery 210 may be positioned on a lower side of the frame 220. The battery 210 is included in the second module 200 and occupies most of the weight of the second module 200.

The plurality of support portions 300 may be disposed on the other surface (i.e., bottom surface) of the display panel 500. The first support portion 310 may include a concave pattern which is concave in a direction (i.e., the third direction DR3) facing the other surface (i.e., bottom surface) of the display panel 500, and the second support portion 350 may include a convex pattern which is convex in the direction (i.e., the third direction DR3) facing the other surface (i.e., bottom surface) of the display panel 500. The first support portions 310 of the support portions 300 according to an embodiment are made of only the concave pattern, and the second support portions 350 thereof are made of only the convex pattern.

As illustrated in FIG. 3, the second module 200 may move to be close to or away from the first module 100 in the first direction DR1.

As the second module 200 is close to the first module 100, the support portions 300 may be wound around the first roller portion 120, and as the second module 200 moves away from the first module 100, the support portions 300 may be unwound from the first roller portion 120. When the first support portion 310 is wound around the first roller portion 120, the concave pattern thereof may be unrolled, and when the second support portion 350 is wound around the first roller portion 120, the convex pattern thereof may be unrolled. That is, when the first support portion 310 and the second support portion 350 are wound around the first roller portion 120, the concave pattern of the first support portion 310 and the convex portion of the second support portion 350 are flatten to be wound around the first roller portion 120. In addition, when the first support portion 310 is unwound from the first roller portion 120, the first support portion 310 may recover the concave pattern in an unrolled state, and when the second support portion 350 is unwound from the first roller portion 120, the second support portion 350 may recover the convex pattern in an unrolled state.

The first module 100 according to an embodiment may further include a second roller portion 110 disposed in the first housing 130 and spaced apart from the first roller portion 120.

As the second module 200 is close to the first module 100, the display panel 500 may be more wound around the second roller portion 110, and as the second module 200 moves away from the first module 100, the display panel 500 may be unwound from the second roller portion 110. When the display panel 500 is unwound from the second roller portion 110, the support portion 300 is unwound from the first roller portion 120, the first support portion 310 recovers and maintains the concave pattern, and the second support portion 350 recovers and maintains the convex pattern.

A user may use the display panel 500 in a method in which the user holds the first module 100 of the display device, moves the second module 200 in a direction (e.g., the direction opposite to the first direction DR1) away from the first module 100, and then views the display surface (or one surface) of the unwound display panel 500 or presses the display surface. When support characteristics of the unwound support portion 300 supporting the display panel 500 are poor, the unwound display panel 500 may droop downward. In particular, when the user presses the display surface of the display panel 500, the display surface pressed by the user may be drooped downward. However, since the support portion 300 according to an embodiment includes the second support portion 350 having the convex pattern which is convex in the direction (e.g., the third direction DR3) facing the other surface (i.e., bottom surface) of the display panel 500 as described above, it is possible to prevent the unwound display panel 500 from drooping downward by improving the support characteristics of the unwound support portion 300 supporting the display panel 500.

The first support portion 310 having the concave pattern may prevent the second module 200 from drooping downward. As described above, the second module 200 further includes the battery 210 disposed in the second housing 230, which may occupy a significant weight of the second module 200. When the user does not hold the second module 200 after the user moves the second module 200 in the direction away from the first module 100 to unwind the display panel 500, the second module 200 including the battery 210 may droop downward. However, since the support portion 300 according to an embodiment further includes the first support portion 310 having the concave pattern, it is possible to prevent the second module 200 from drooping downward.

However, the functions of the first and second support portions 310 and 350 are not limited thereto.

That is, the first support portion 310 having the concave pattern may also prevent the unwound display panel 500 from drooping downward by improving the support characteristics of the unwound support portion 300 supporting the display panel 500, and the second support portion 350 having the convex pattern may also prevent the second module 200 from drooping downward.

Figure 7:
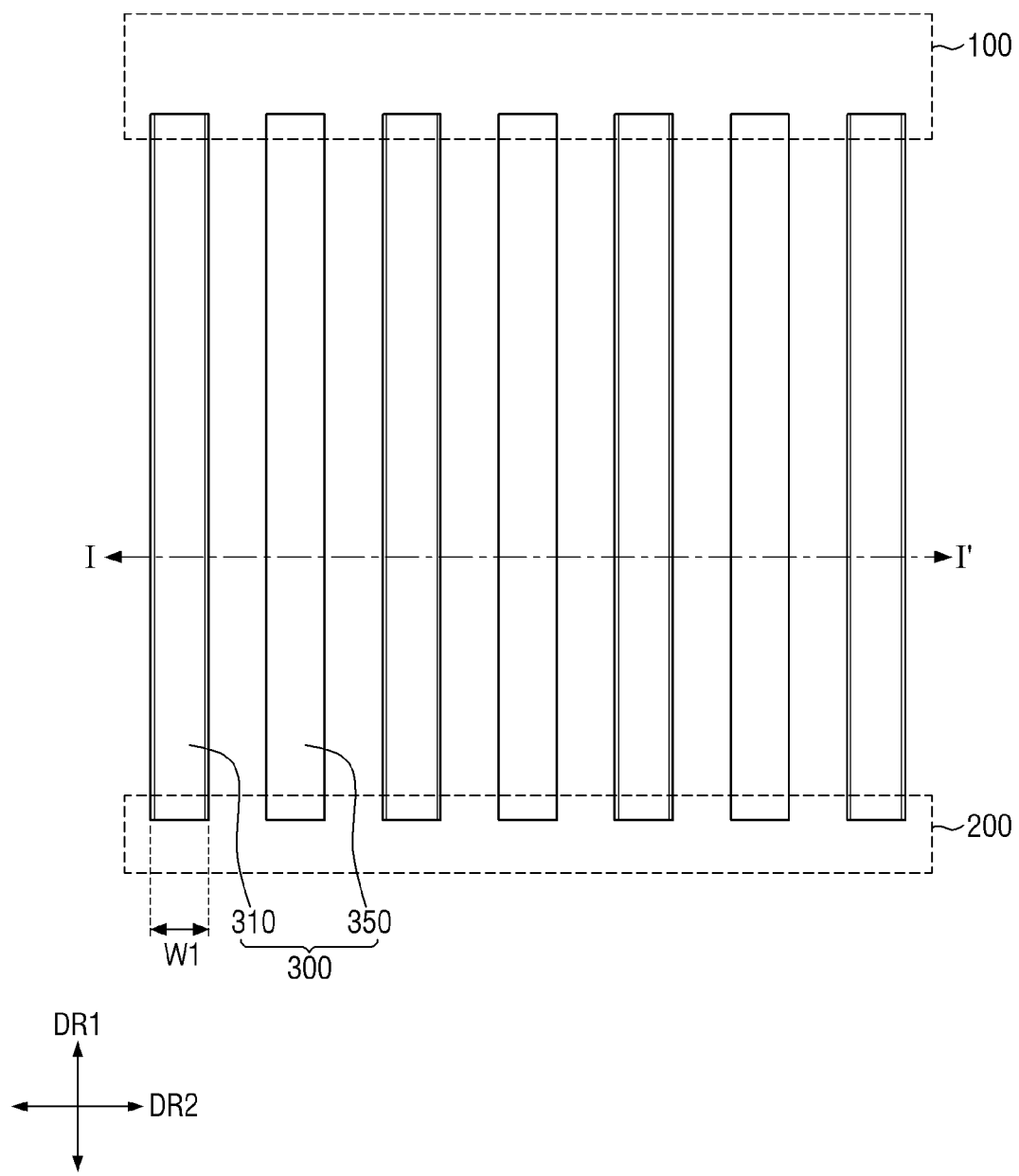
FIG. 7 is a plan view of the first module, the second module, and the support portion of FIG. 4.
Figure 8:
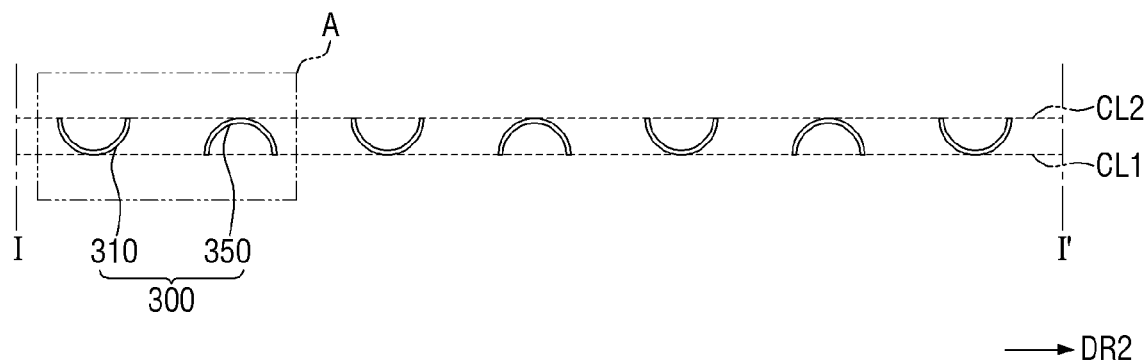
FIG. 8 is a cross-sectional view taken along line I-I' of FIG. 7.
Figure 9:
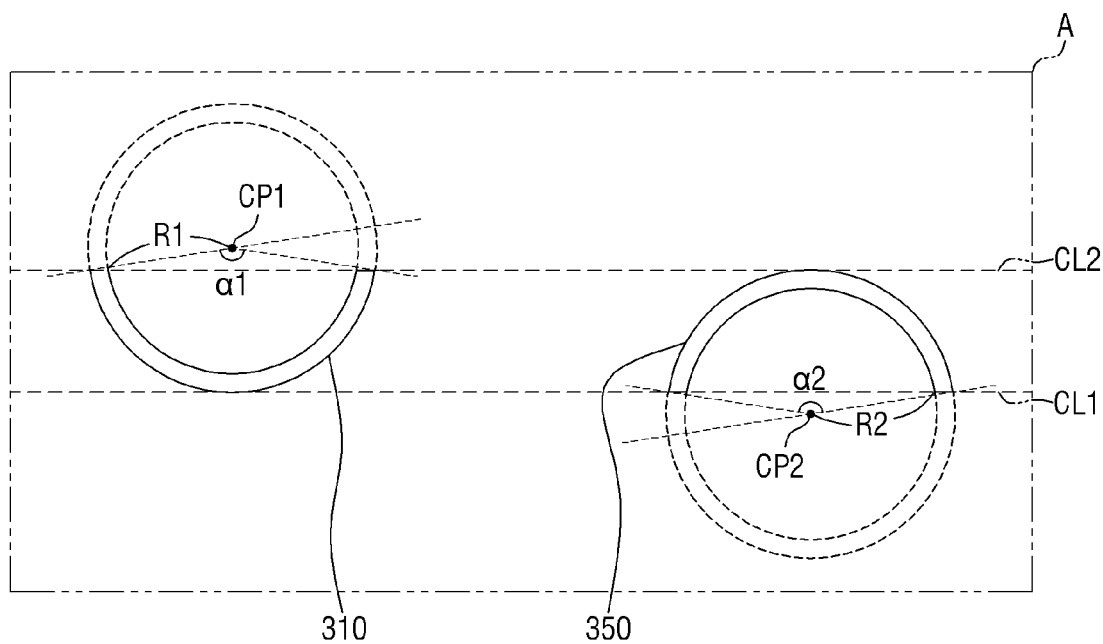
FIG. 9 is an enlarged cross-sectional view of area A of FIG. 8.
Figure 10:
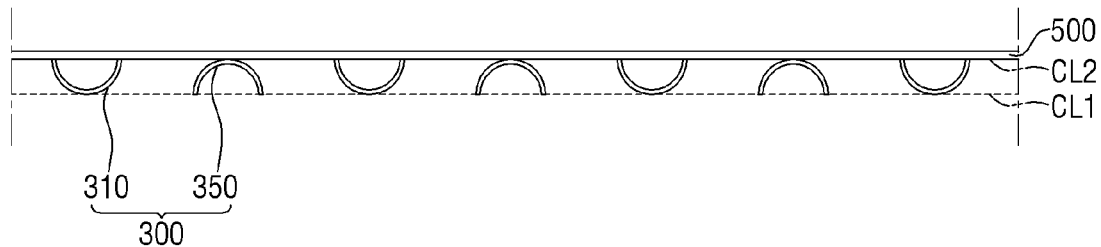
FIG. 10 is a cross-sectional view illustrating a state in which a display panel is disposed on the support portion of FIG. 8.

FIG. 7 is a plan view of the first module, the second module, and the support portion of FIG. 4. FIG. 8 is a cross-sectional view taken along line I-I' of FIG. 7. FIG. 9 is an enlarged cross-sectional view of area A of FIG. 8. FIG. 10 is a cross-sectional view illustrating a state in which a display panel is disposed on the support portion of FIG. 8. As used herein, the "plan view" may be defined as a view from the third direction DR3.

Referring to FIGS. 7 to 10, each of the first support portion 310 and the second support portion 350 may have a first width W1 in the second direction DR2. The first support portion 310 and the second support portion 350 may be alternately and repeatedly arranged along the second direction DR2. However, the present disclosure is not limited thereto, and in another embodiment, the first support portion 310 and the second support portion 350 are not alternately arranged, and two or more first support portions 310 may be continuously arranged along the second direction DR2, and then the second support portion 350 may be disposed, or two or more second support portions 350 may be continuously arranged along the second direction DR2, and then the first support portion 310 may also be disposed.

The first support portion 310 and the second support portion 350 adjacent to each other are spaced apart from each other with a predetermined separation distance along the second direction DR2, and the separation distance may be set so that the wound first support portion 310 and the wound second support portion 350 adjacent to each other do not come into contact with each other.

As illustrated in FIGS. 7, 8, and 10, a first virtual extension line CL1 and a second virtual extension line CL2 each extending in the second direction DR2 are defined. The second virtual extension line CL2 is positioned above the first virtual extension line CL1. The first virtual extension line CL1 and the second virtual extension line CL2 are introduced to explain the arrangement of the first support portion 310 and the second support portion 350 more clearly.

The most concave portion of the first support portion 310 may be in contact with the first virtual extension line CL1, and the most convex portion of the second support portion 350 may be in contact with the second virtual extension line CL2.

Referring to FIG. 9, each of the first support portion 310 and the second support portion 350 may have a cross-sectional shape having an arc shape. Central angles of the arc shapes of the first support portion 310 and the second support portion 350 may be equal to each other. For example, the central angles $\alpha 1$ and $\alpha 2$ of the arc shapes with respect to the centers CP1 and CP2 may be the same and be greater than 90 degrees and smaller than 180 degrees. For example, the central angle may be about 130 degrees. In addition, radii of curvature R1 and R2 of the first support portion 310 and the second support portion 350 may be equal to each other.

As illustrated in FIG. 10, the display panel 500 may be disposed and supported on the first and second support portions 310 and 350. As described above, since the support portion 300 includes the second support portion 350 having the convex pattern which is convex in the direction facing the other surface (i.e., the bottom surface) of the display panel 500, it is possible to prevent the unwound display panel 500 from drooping downward by improving the support characteristics of the unwound support portion 300 supporting the display panel 500, and the first support portion 310 having the concave pattern may prevent the second module 200 from drooping downward.

Hereinafter, other embodiments will be described.

Figure 11:
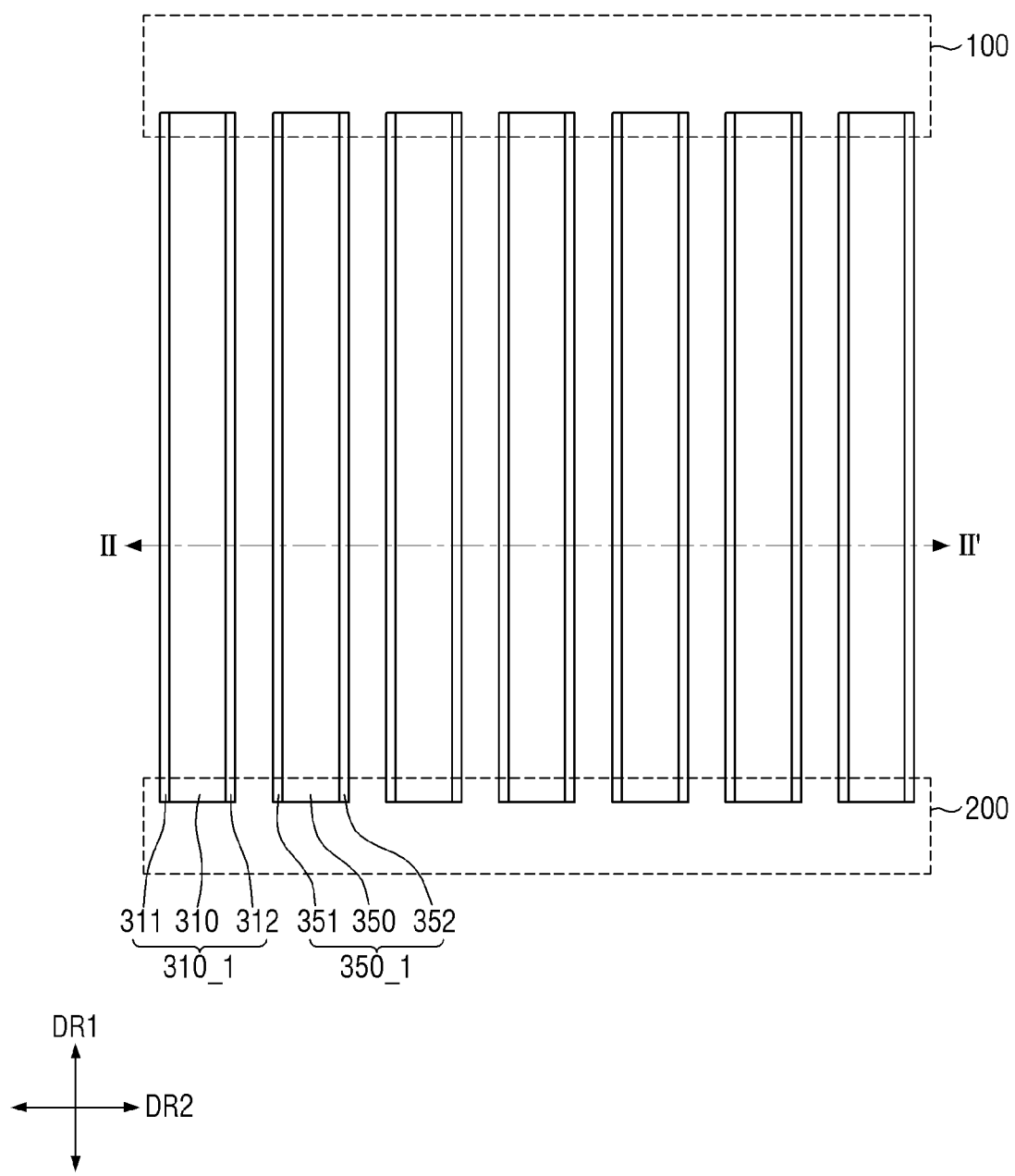
FIG. 11 is a plan view of a first module, a second module, and a support portion according to another embodiment.
Figure 12:
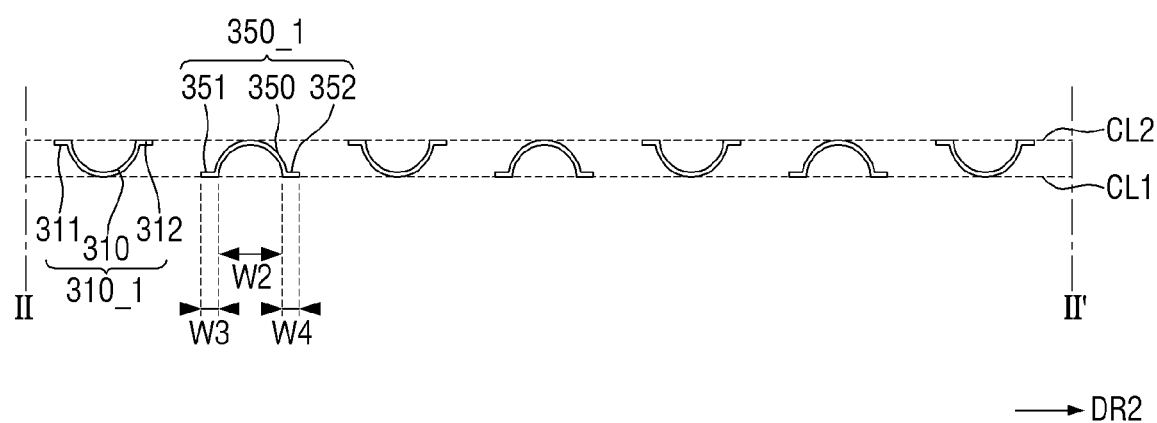
FIG. 12 is a cross-sectional view taken along line II-II' of FIG. 11.

FIG. 11 is a plan view of a first module, a second module, and a support portion according to another embodiment. FIG. 12 is a cross-sectional view taken along line II-IF of FIG. 11. Referring to FIGS. 11 and 12, the present embodiment is different from the embodiment of FIGS. 7 and 8 in that support portions 310_1 and 350_1 of the display device according to the present embodiment further include a sub-support portion, respectively.

A first support portion 310_1 may include the first support portion 310 (or concave pattern) of FIG. 7 and first sub-support portions 311 and 312 connected to the first support portion 310, and a second support portion 350_1 may include the second support portion 350 (or convex pattern) of FIG. 7 and second sub-support portions 351 and 352 connected to the second support portion 350. The first sub-support portions 311 and 312 may be aligned with the second virtual extension line CL2, and the second sub-support portions 351 and 352 may be aligned with the first virtual extension line CL1. The first sub-support portions 311 and 312 and the uppermost convex portion of the second support portion 350 may support the display panel 500 of FIG. 10. The first support portion 310 and the second support portion 350 may each have a predetermined width W2, the first sub-support portion 311 and the second sub-support portion 351 may have predetermined width W3, and the first sub-support portion 312 and the second sub-support portion 352 may have predetermined width W4 in the second direction DR2. The width W2 of the first support portion 310 may be greater than a sum of the width W3 of the first sub-support portion 311 and the width W4 of the first sub-support portion 312, and the width W2 of the second support portion 350 may be greater than a sum of the width W3 of the second sub-support portion 351 and the width W4 of the second sub-support portion 352.

Since other configurations have been described above with reference to FIGS. 7 and 8, detailed descriptions thereof will be omitted.

Figure 13:
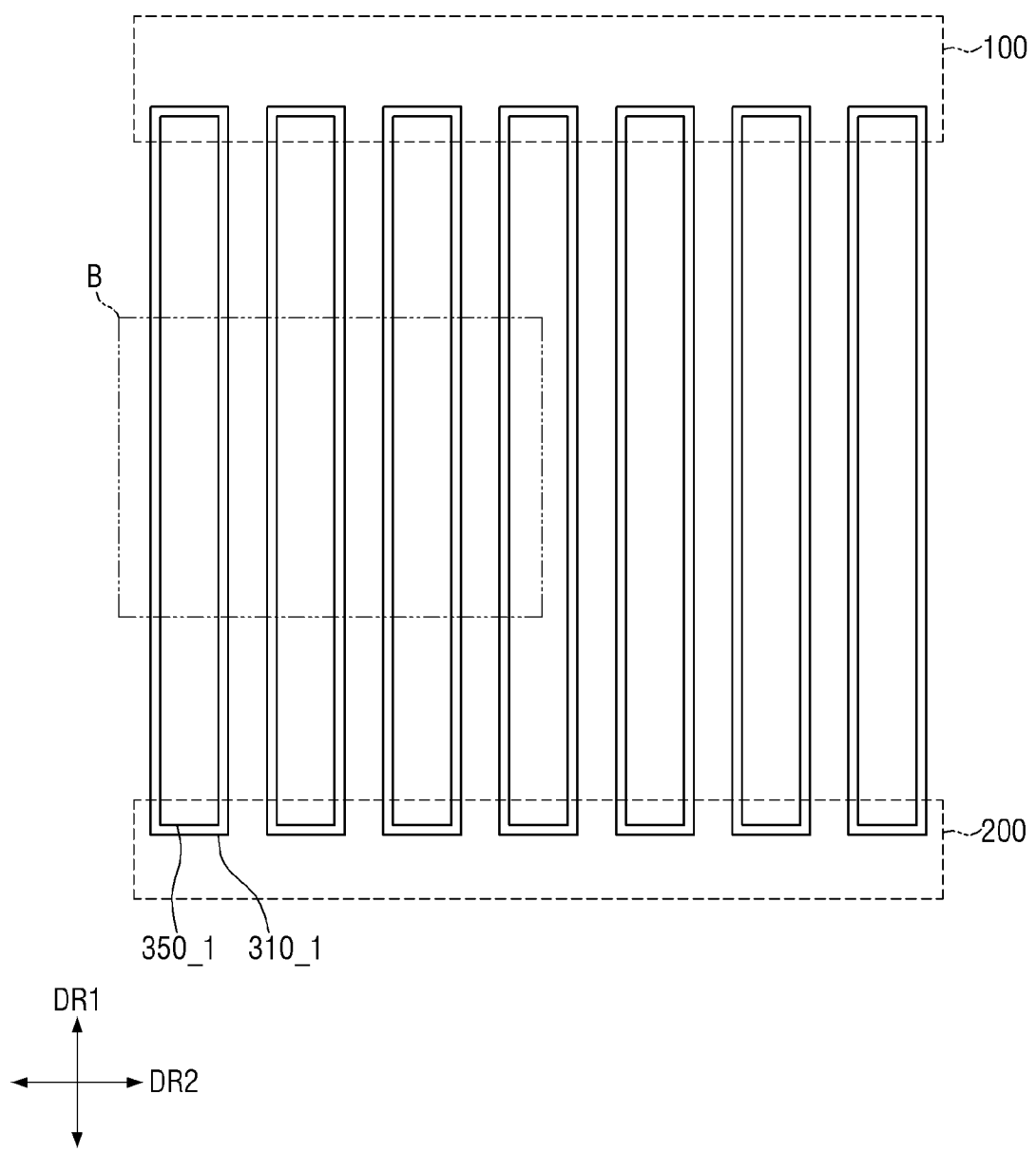
FIG. 13 is a plan view of a first module, a second module, and a support portion according to still another embodiment.
Figure 14:
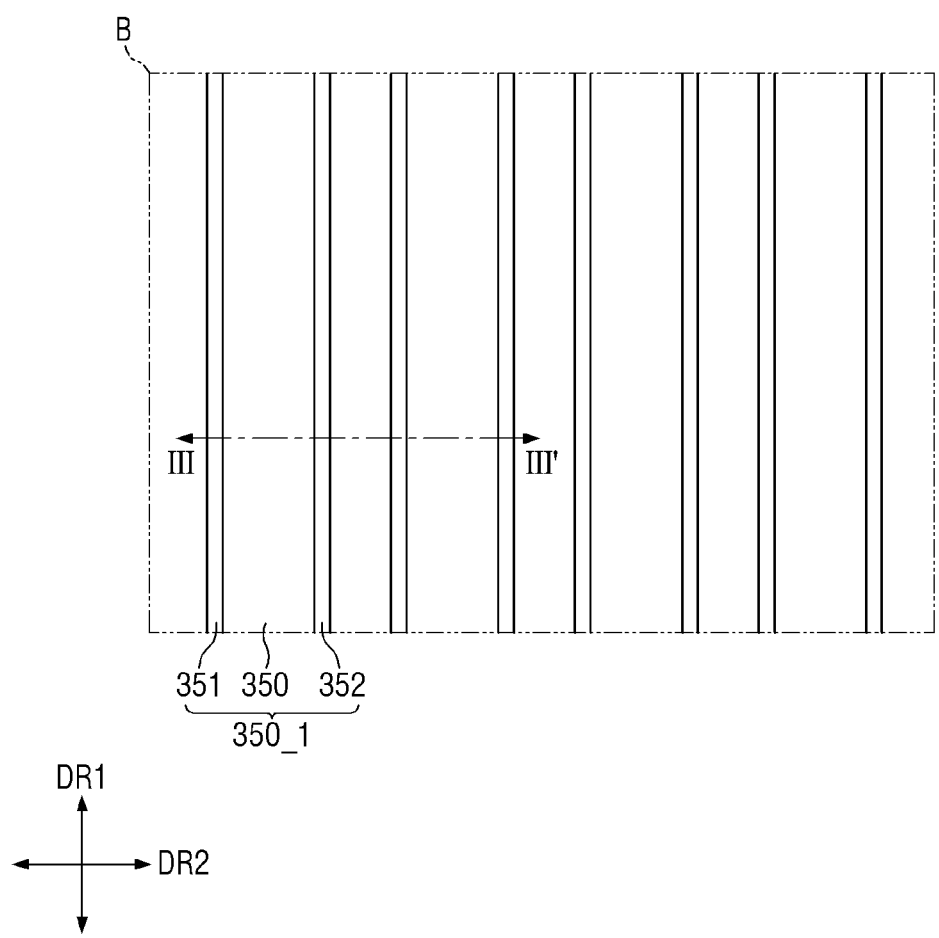
FIG. 14 is an enlarged plan view of a partial area B of FIG. 13.
Figure 15:
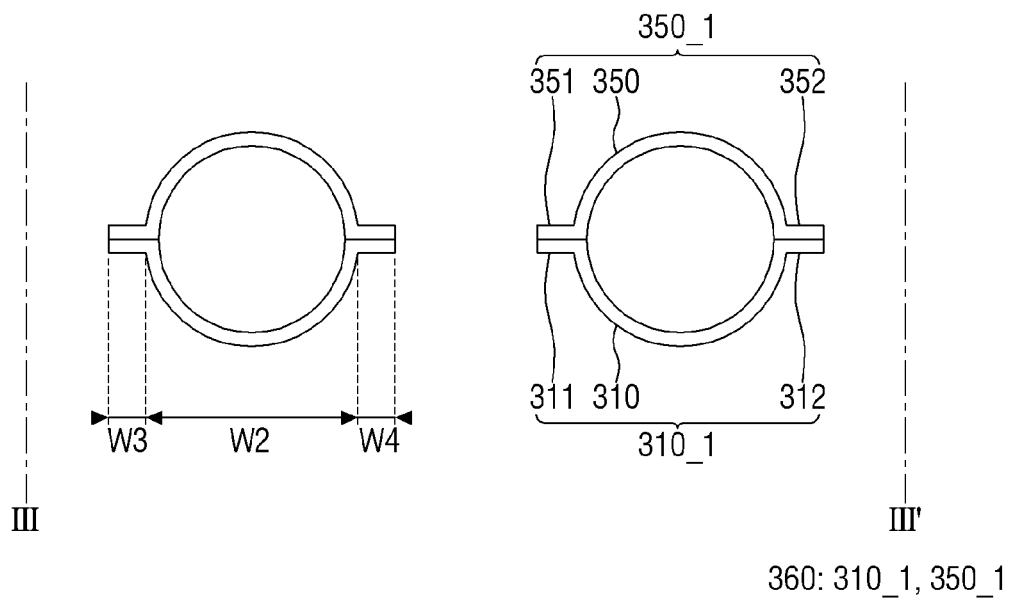
FIG. 15 is a cross-sectional view taken along line III-III' of FIG. 14.

FIG. 13 is a plan view of a first module, a second module, and a support portion according to still another embodiment. FIG. 14 is an enlarged plan view of a partial area of FIG. 13. FIG. 15 is a cross-sectional view taken along line of FIG. 14.

Referring to FIGS. 13 to 15, a support portion 360 according to the present embodiment is different from the support portion 300 of FIGS. 7 and 8 in that first and second support portions 360 have the same shape.

More specifically, each of support portions 360 may include the first support portion 310_1 and the second support portion 350_1 of FIGS. 11 and 12. The second support portion 350_1 may be positioned between the first support portion 310_1 and the display panel (500 in FIG. 10). The first sub-support portion 311 and the second sub-support portion 351 may be in contact with each other, and the first sub-support portion 312 and the second sub-support portion 352 may be in contact with each other.

Figure 16:
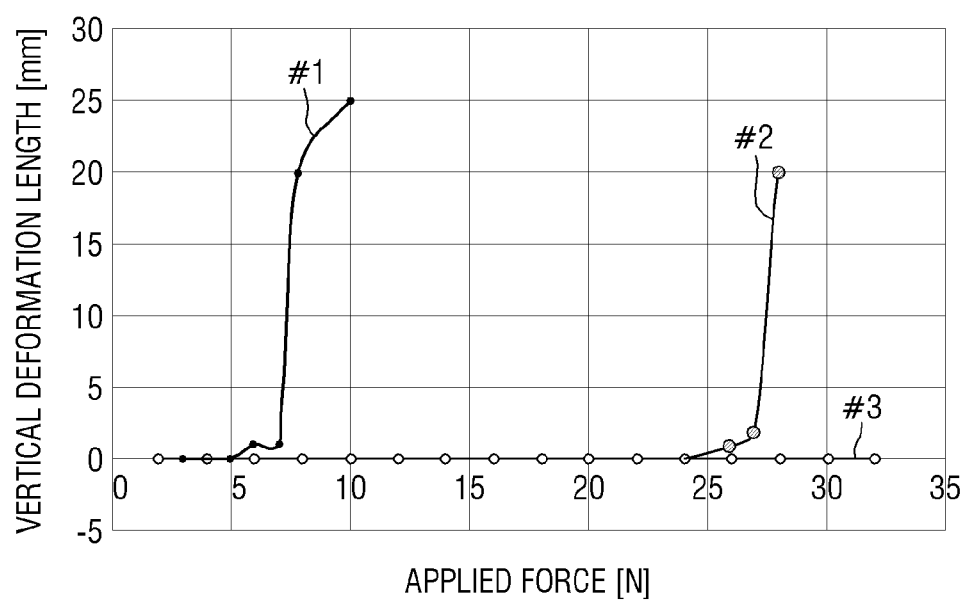
FIG. 16 is a graph illustrating a vertical deformation length of a display panel versus a force applied to the display device.

FIG. 16 is a graph illustrating a vertical deformation length of a display panel according to a force applied to the display device. A horizontal axis of the graph of FIG. 16 represents a force (or applied force (newton: N)) that presses the display surface of the unwound display panel 500 from above, a vertical axis represents a vertical (or downward DR3) deformation length (millimeters: mm) of the display panel 500, and the graph of FIG. 16 illustrates a first embodiment (#1), a second embodiment (#2), and a third embodiment (#3). The first embodiment (#1) is a case in which the support portion is applied only as the concave pattern in FIG. 1, the second embodiment (#2) is a case in which the support portion 300 in which the convex pattern and the concave pattern of FIG. 1 are alternately disposed is applied, and the third embodiment (#3) is a case in which the support portion 360 of FIG. 15 is applied.

Figure 17:
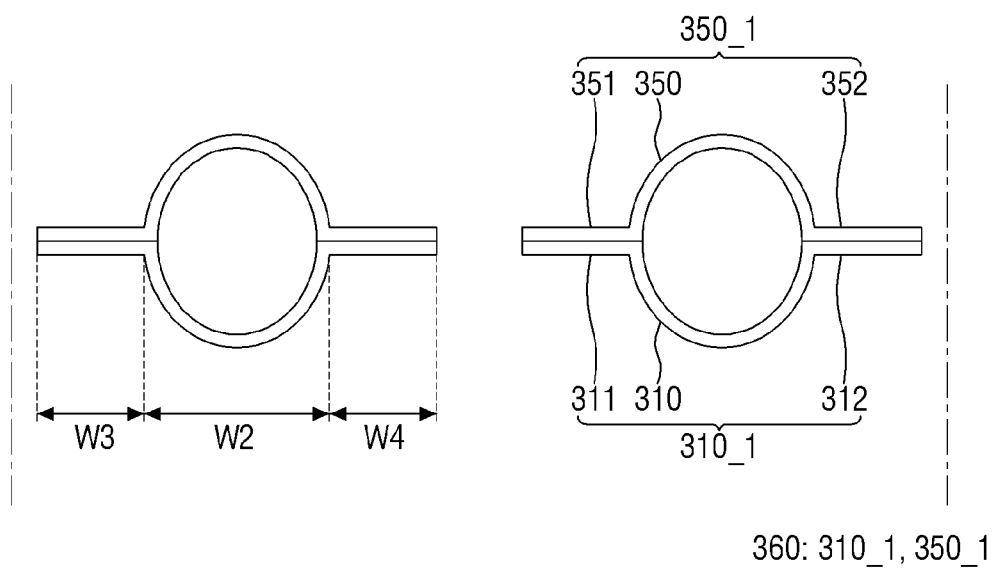
FIG. 17 is a cross-sectional view illustrating another example of a first support portion and a second support portion according to FIG. 15.

As illustrated in FIG. 16, it was confirmed that an amount of drooping sharply increased after 7N in the case of a first sample (#1), there was no change in the amount of drooping up to 23N in the case of a second sample (#2), and there was no change in the amount of drooping up to 30N or more in the case of a third sample (#3). FIG. 17 is a cross-sectional view illustrating another example of a first support portion and a second support portion according to FIG. 15.

Referring to FIG. 17, the present embodiment is different from the embodiment of FIG. 15 in that the predetermined width W2 may be equal to or smaller than the sum of the widths W3 and W4.

According to the present embodiment, since a contact area between the first support portion 310_1 and the second support portion 350_1 is increased, stability of the support portion 360 may be improved.

Figure 18:
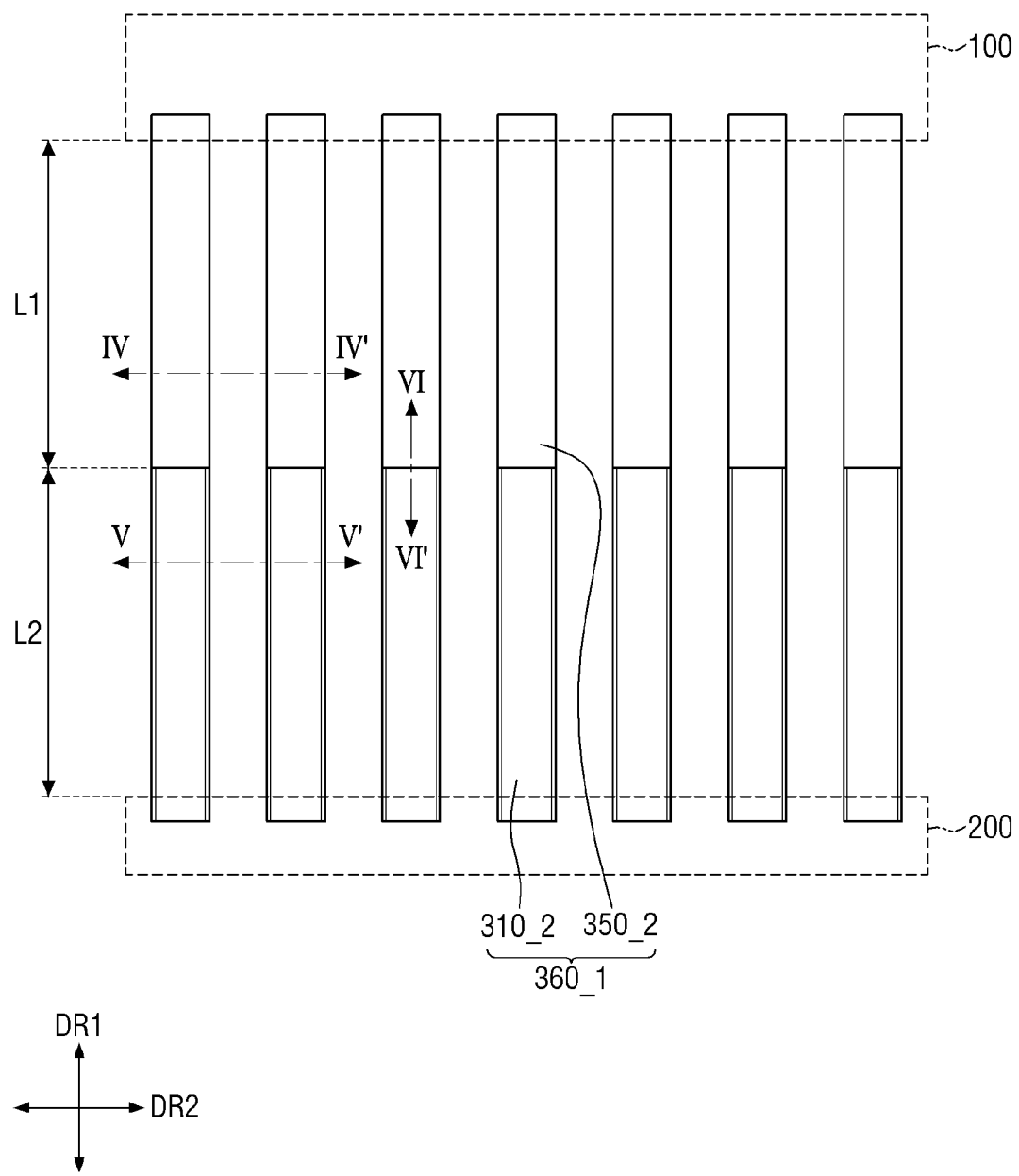
FIG. 18 is a plan view of a first module, a second module, and a support portion according to still another embodiment.
Figure 19:
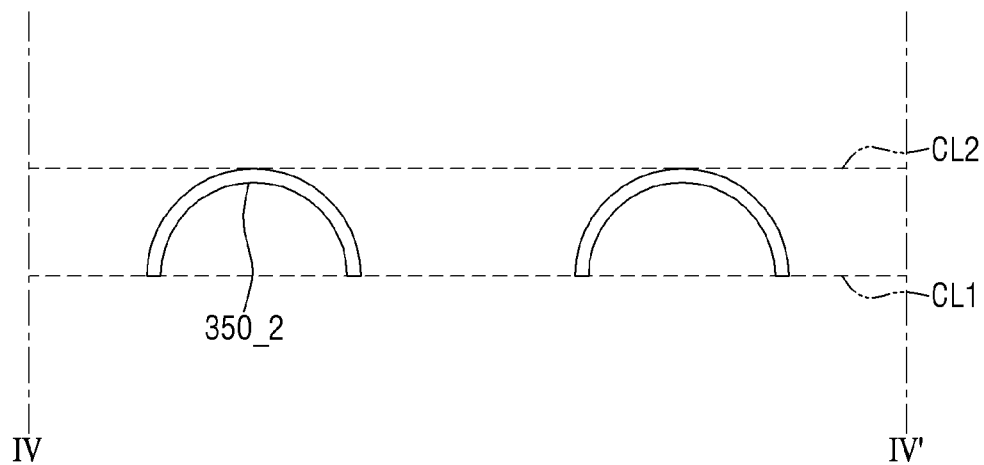
FIG. 19 is a cross-sectional view taken along line IV-IV' of FIG. 18.
Figure 20:
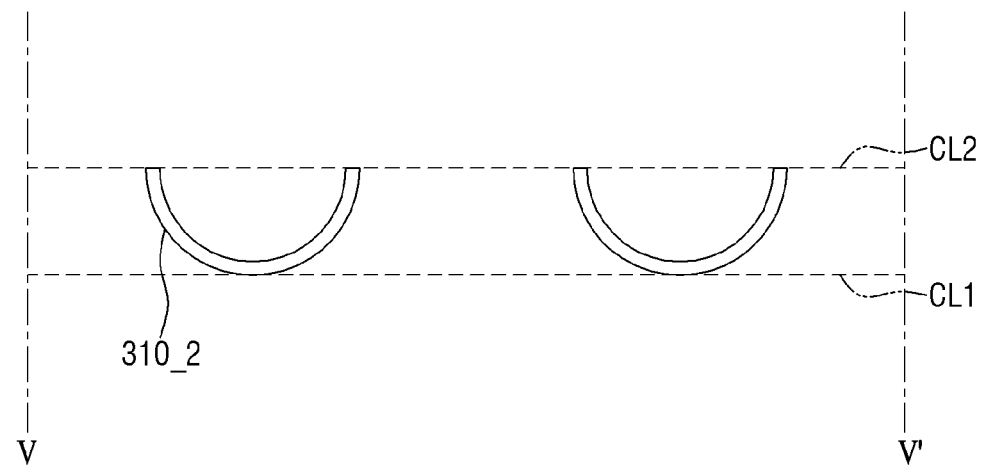
FIG. 20 is a cross-sectional view taken along line V-V' of FIG. 18.
Figure 21:
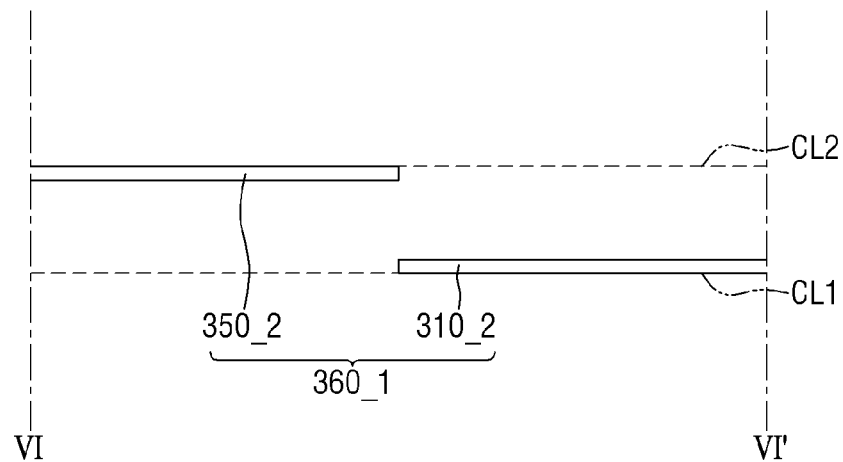
FIG. 21 is a cross-sectional view taken along line VI-VI' of FIG. 18.

FIG. 18 is a plan view of a first module, a second module, and a support portion according to still another embodiment. FIG. 19 is a cross-sectional view taken along line IV-IV' of FIG. 18. FIG. 20 is a cross-sectional view taken along line V-V' of FIG. 18. FIG. 21 is a cross-sectional view taken along line VI-VI' of FIG. 18.

Referring to FIGS. 18 to 21, the present embodiment is different from the embodiment of FIGS. 7 and 8 in that a first support portion and a second support portion next to the first support portion in the second direction DR2 have the same shape, and the first support portion and the second support portion each have a convex pattern and a concave pattern mixed with each other. Hereinafter, the first support portion and the second support portion will be collectively called as "support portion 360_1".

More specifically, each of the support portions 360_1 may include a concave pattern 310_2 and a convex pattern 350_2. In a plan view, the convex pattern 350_2 may be disposed between the concave pattern 310_2 and the first module 100 in a cross-sectional view such as FIGS. 19 and 20. An end portion of the other side of the convex pattern 350_2 in the first direction DR1 may be directly connected to an end portion of one side of the concave pattern 310_2 in the first direction DR1 as shown in FIG. 18. Furthermore, a length L1 (in the first direction DR1) of a portion of the convex pattern 350_2 that does not overlap the first module 100 in a plan view may be the same as a length L2 of the portion of the concave pattern 310_2 that does not overlap the second module 200.

Figure 22:
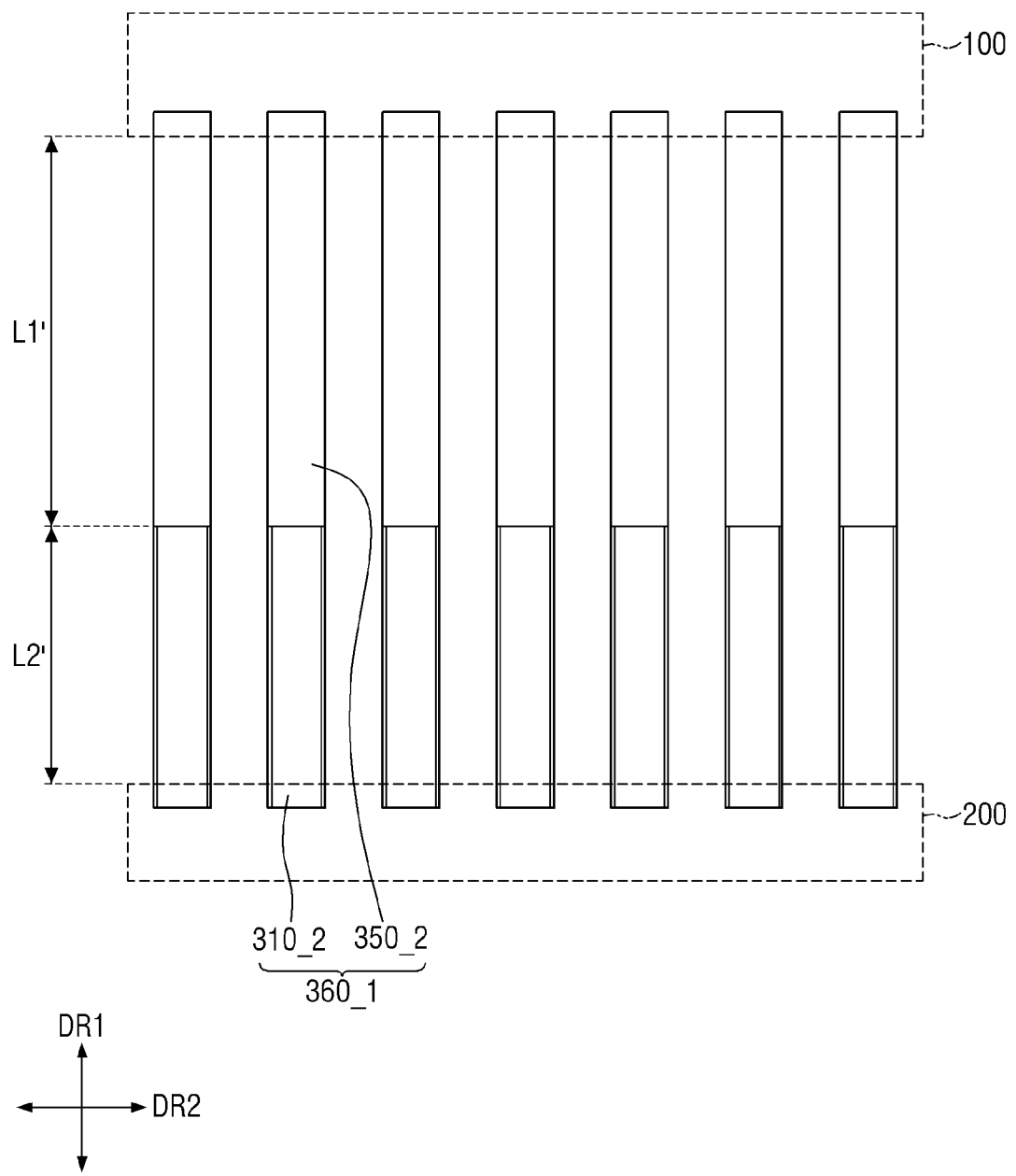
FIG. 22 is a plan view of a first module, a second module, and a support portion according to still another embodiment.

FIG. 22 is a plan view of a first module, a second module, and a support portion according to still another embodiment.

Referring to FIG. 22, the present embodiment is different from the embodiment of FIG. 18 in that in the support portions 360_1 of the display device according to the present embodiment, a length L1' of a portion of the convex pattern 350_2 that does not overlap the first module 100 in a plan view is greater than a length L2' of the portion of the concave pattern 310_2 that does not overlap the second module 200.

Figure 23:
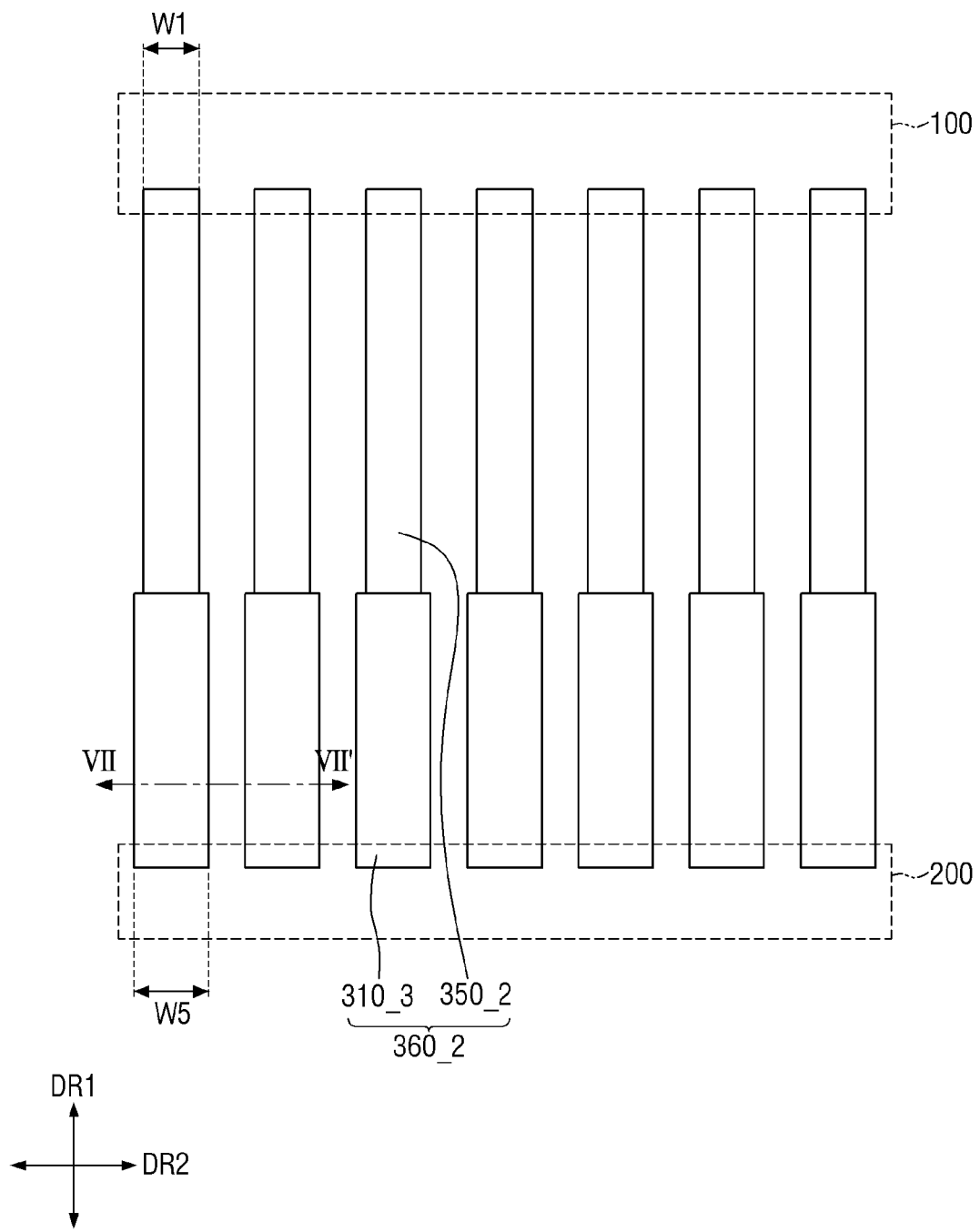
FIG. 23 is a plan view of a first module, a second module, and a support portion according to still another embodiment.
Figure 24:
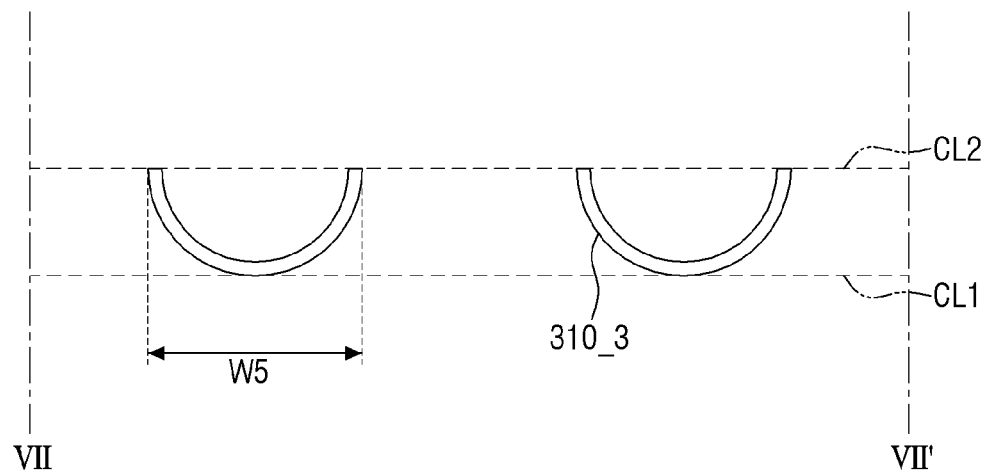
FIG. 24 is a cross-sectional view taken along line VII-VII' of FIG. 23.

FIG. 23 is a plan view of a first module, a second module, and a support portion according to still another embodiment. FIG. 24 is a cross-sectional view taken along line VII-VII' of FIG. 23.

Referring to FIGS. 23 and 24, the present embodiment is different from the embodiment of FIG. 22 in that a width W5 of a concave pattern 310_3 of a support portion 360_2 of the display device according to the present embodiment in the second direction DR2 is greater than a width W1 of a convex pattern 350_2 thereof in the second direction DR2.

Figure 25:
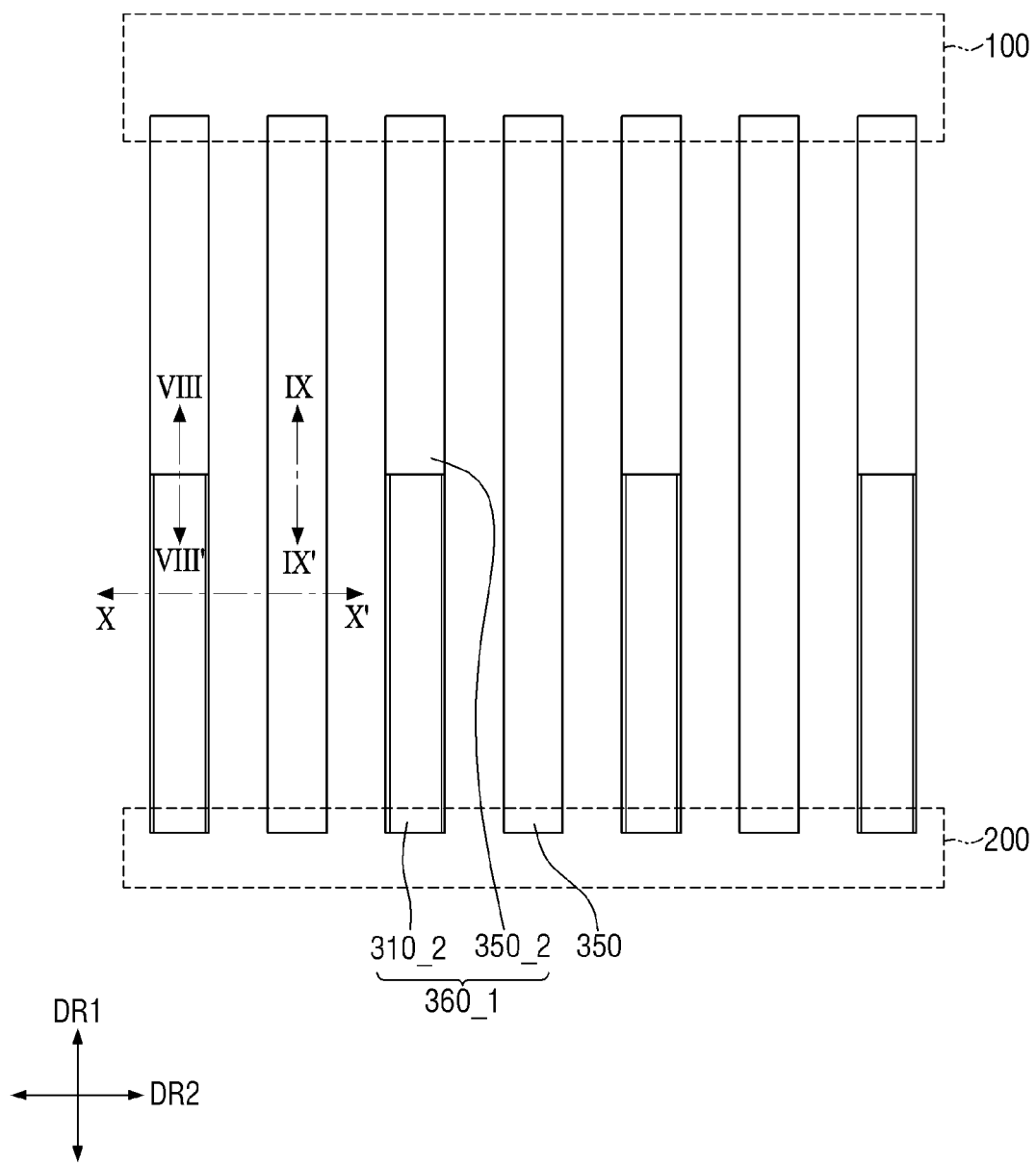
FIG. 25 is a plan view of a first module, a second module, and a support portion according to still another embodiment.
Figure 26:
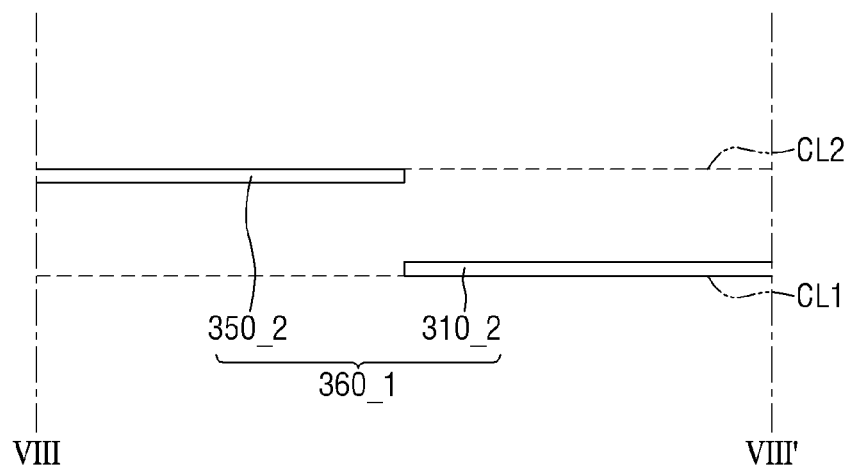
FIG. 26 is a cross-sectional view taken along line VIII-VIII' of FIG. 25.
Figure 27:
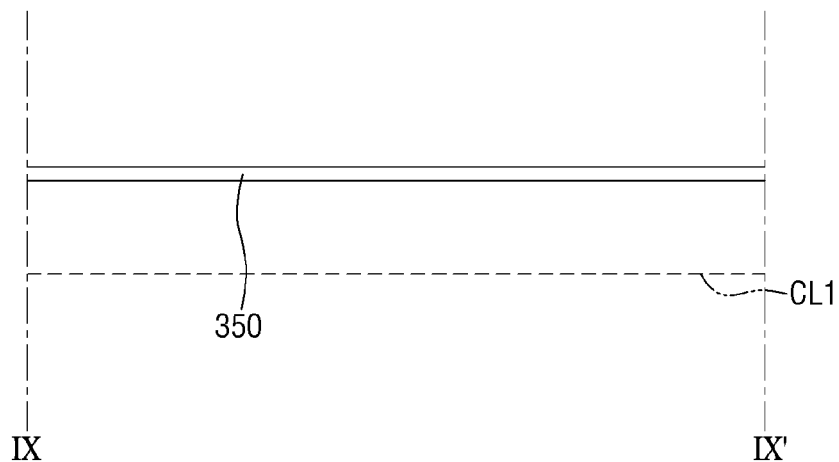
FIG. 27 is a cross-sectional view taken along line IX-IX' of FIG. 25.
Figure 28:
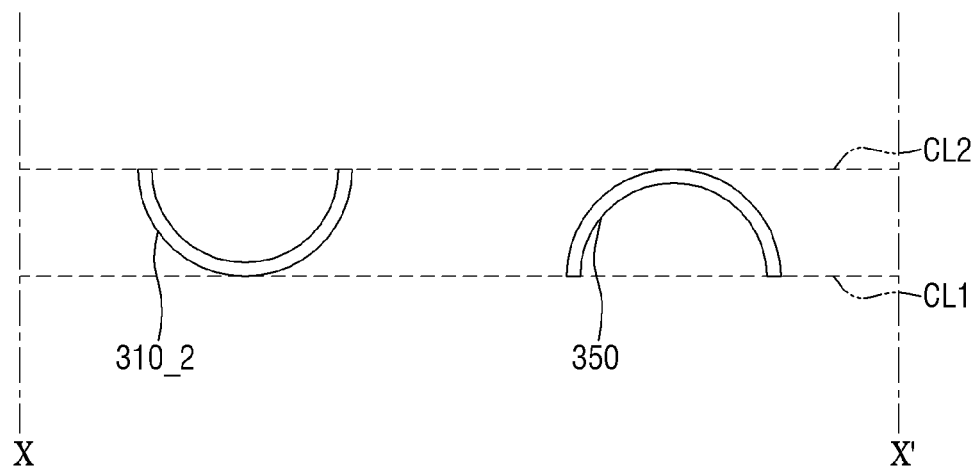
FIG. 28 is a cross-sectional view taken along line X-X' of FIG. 25.

FIG. 25 is a plan view of a first module, a second module, and a support portion according to still another embodiment. FIG. 26 is a cross-sectional view taken along line VIII-VIII' of FIG. 25. FIG. 27 is a cross-sectional view taken along line IX-IX' of FIG. 25. FIG. 28 is a cross-sectional view taken along line X-X' of FIG. 25.

Referring to FIGS. 25 to 28, the present embodiment is different from the embodiment of FIGS. 18 to 21 in that support portions 360_1 and 350 of the display device according to the present embodiment include the first support portion 360_1 of FIG. 18 and the second support portion 350 of FIG. 7.

Since the first support portion 360_1 is described above with reference to FIG. 18 and the second support portion 350 is described above with reference to FIG. 7, the detailed descriptions thereof will be omitted.

Figure 29:
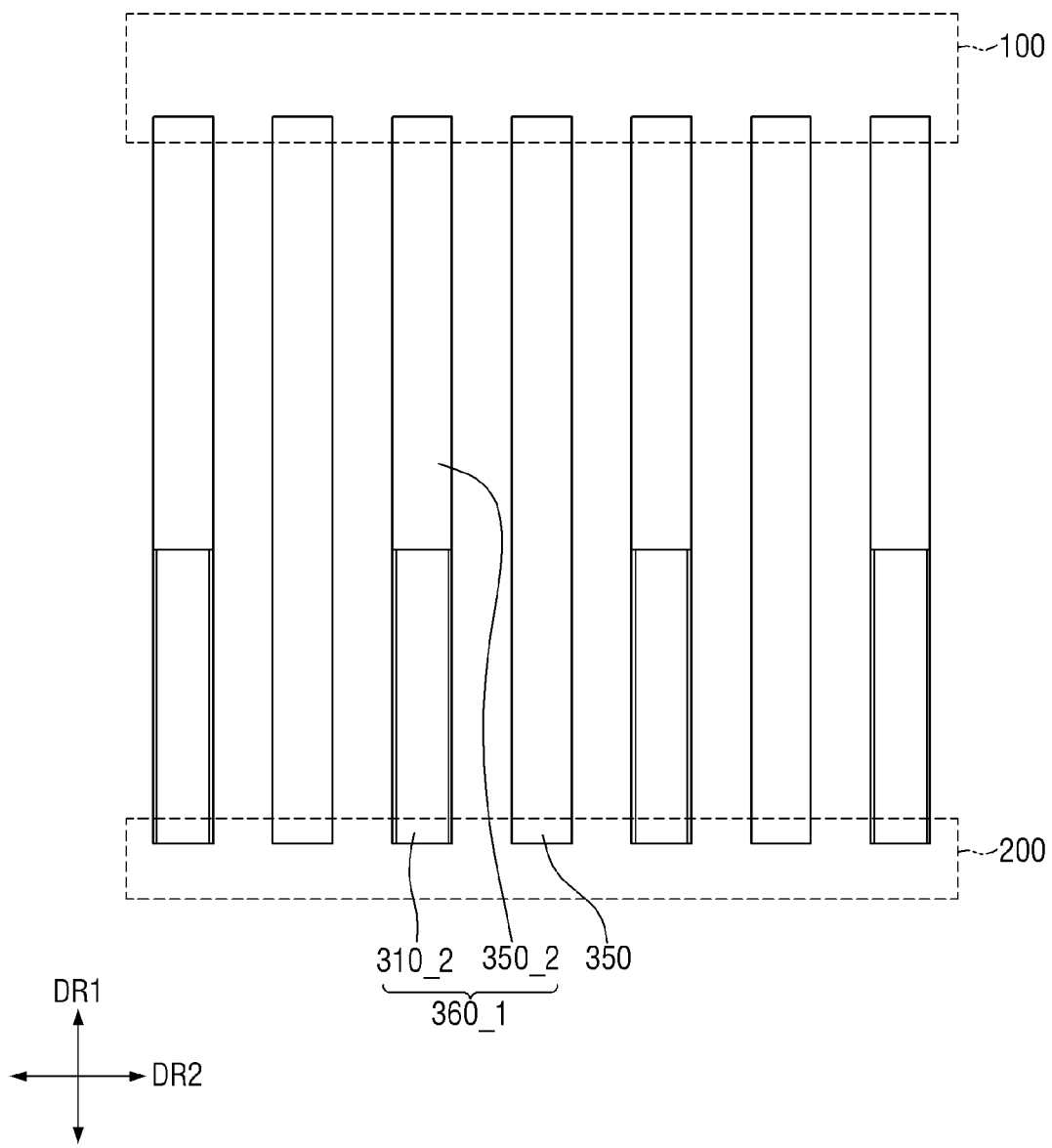
FIG. 29 is a plan view of a first module, a second module, and a support portion according to still another embodiment.

FIG. 29 is a plan view of a first module, a second module, and a support portion according to still another embodiment.

Referring to FIG. 29, the present embodiment is different from the embodiment of FIG. 25 in that the support portions 360_1 and 350 of the display device according to the present embodiment have the same first support portion 360_1 as the first support portion 360_1 of FIG. 22.

Since other descriptions have been made with reference to FIG. 25, detailed descriptions thereof will be omitted.

Figure 30:
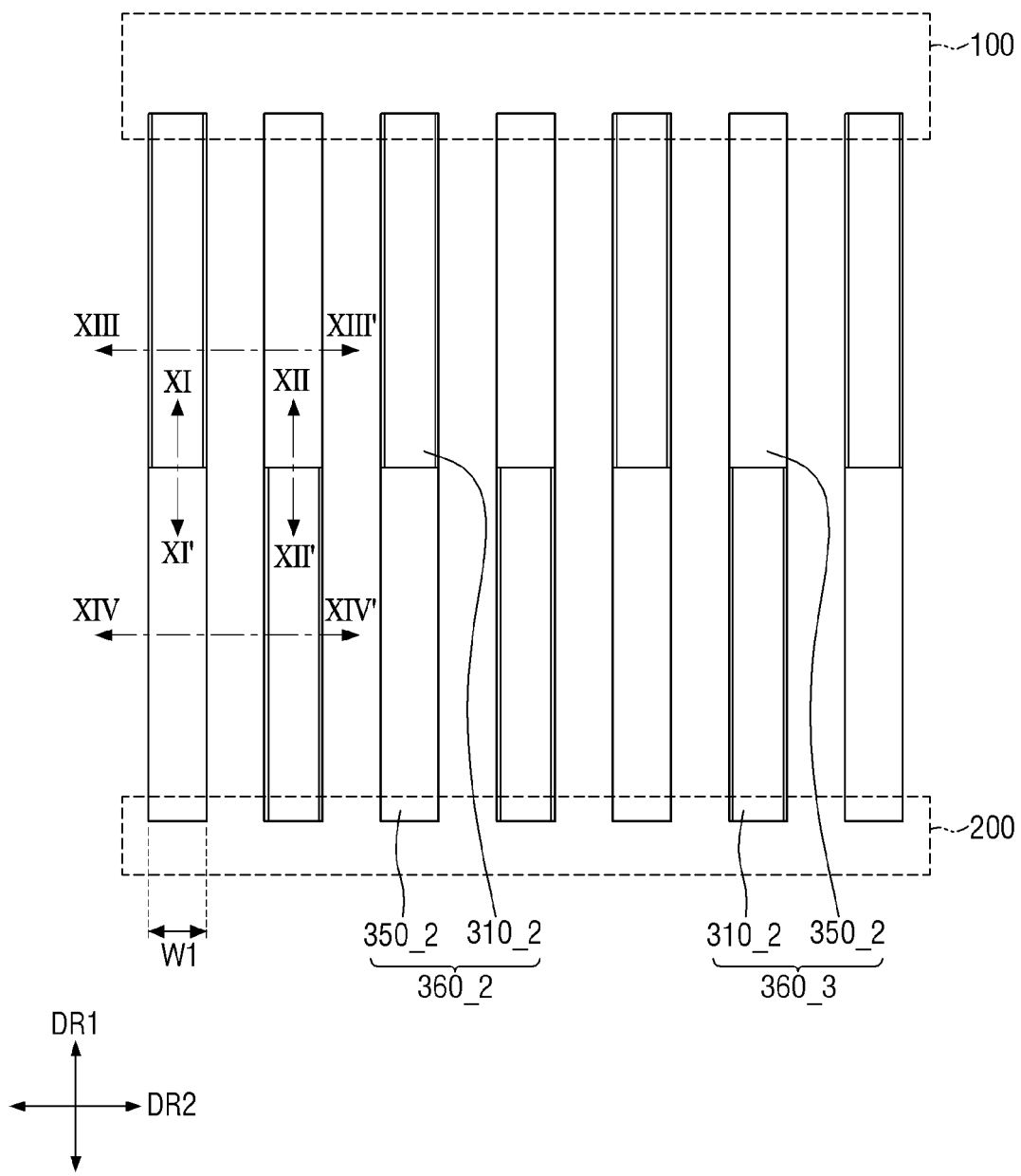
FIG. 30 is a plan view of a first module, a second module, and a support portion according to still another embodiment.
Figure 31:
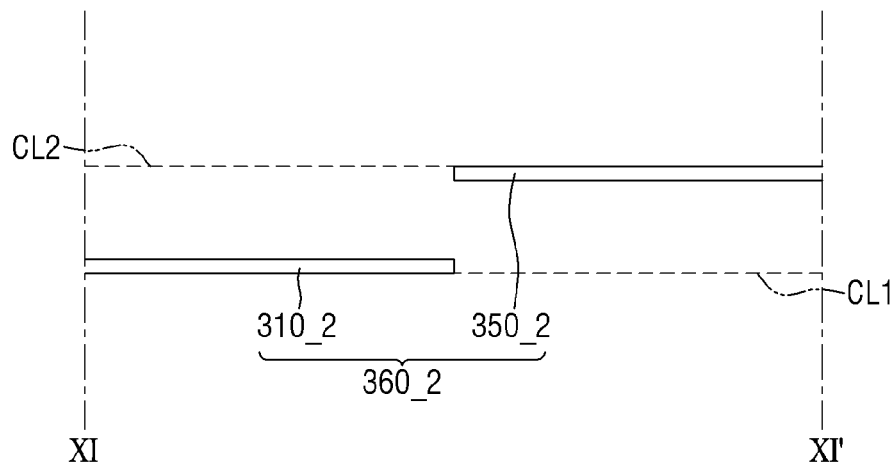
FIG. 31 is a cross-sectional view taken along line XI-XI' of FIG. 30.
Figure 32:
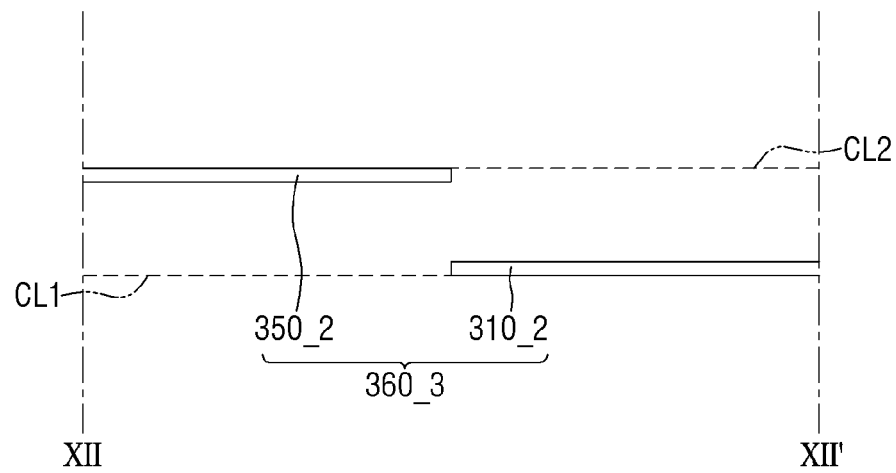
FIG. 32 is a cross-sectional view taken along line XII-XII' of FIG. 30.
Figure 33:
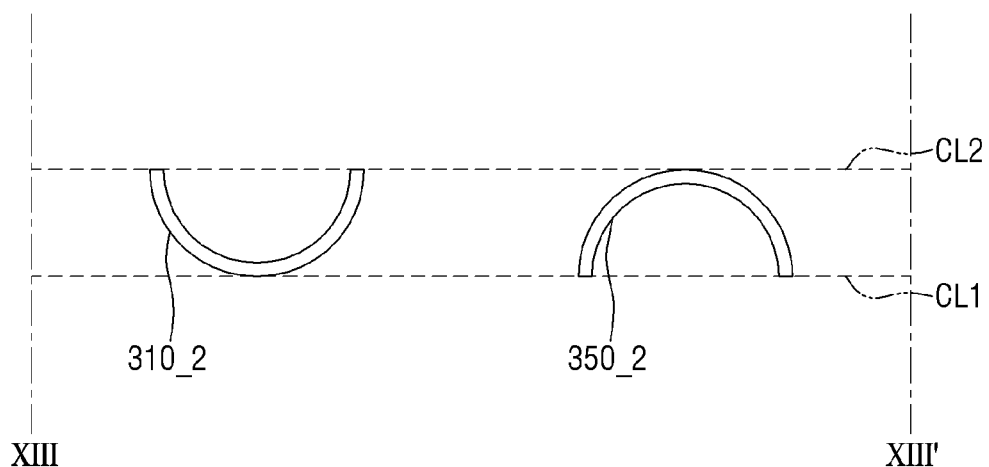
FIG. 33 is a cross-sectional view taken along line of FIG. 30.
Figure 34:
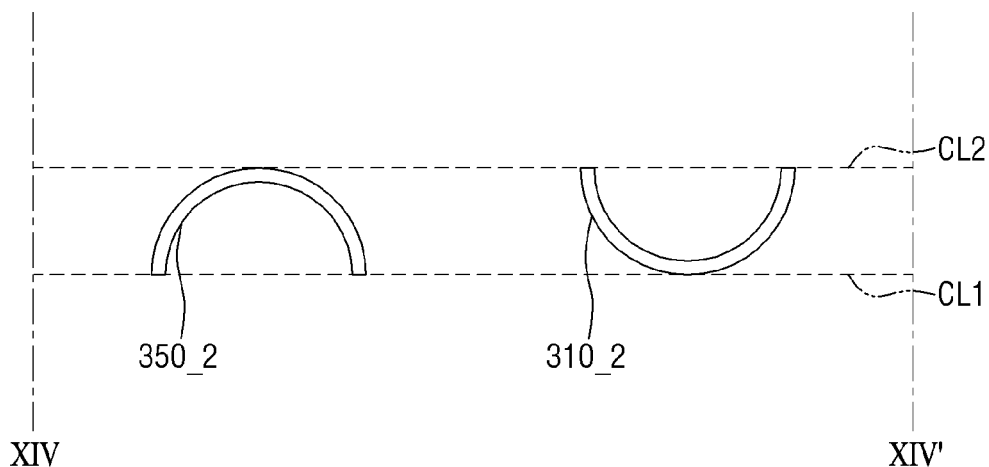
FIG. 34 is a cross-sectional view taken along line XIV-XIV' of FIG. 30.

FIG. 30 is a plan view of a first module, a second module, and a support portion according to still another embodiment. FIG. 31 is a cross-sectional view taken along line XI-XI' of FIG. 30. FIG. 32 is a cross-sectional view taken along line XII-XII' of FIG. 30. FIG. 33 is a cross-sectional view taken along line XIII-XIII' of FIG. 30. FIG. 34 is a cross-sectional view taken along line XIV-XIV' of FIG. 30.

Referring to FIGS. 30 to 34, the present embodiment is different from the embodiment of FIGS. 18 to 21 in that support portions 360_2 and 360_3 of the display device according to the present embodiment include a first support portion 360_2 and a second support portion 360_3.

More specifically, the first support portion 360_2 may include a concave pattern 310_2 and a convex pattern 350_2 positioned between the concave pattern 310_2 and the second module 200 in a plan view, and the second support portion 360_3 may have the same shape as the second support portion 360_1 of FIG. 18.

Since other descriptions have been made with reference to FIG. 18, detailed descriptions thereof will be omitted.

Figure 35:
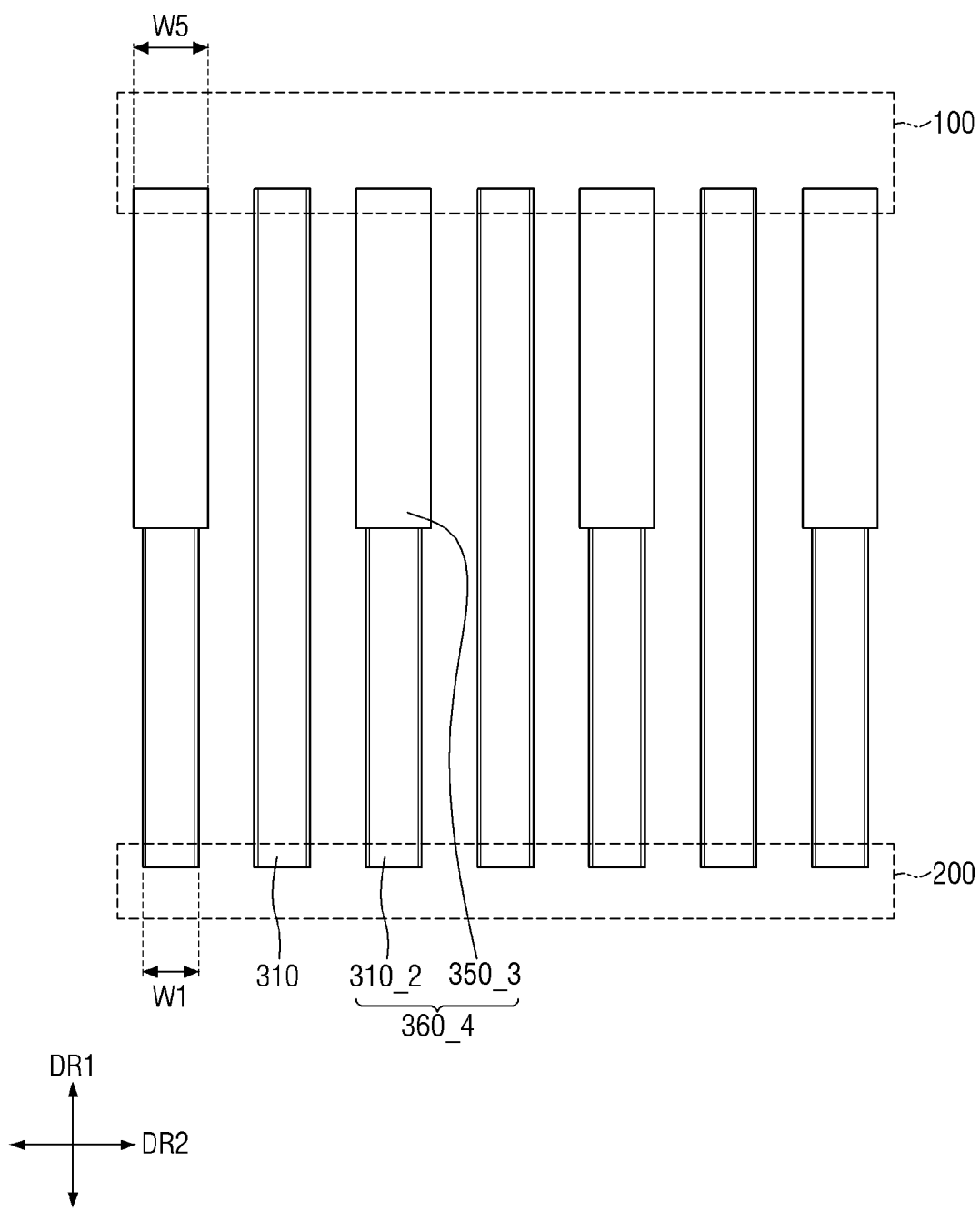
FIG. 35 is a plan view of a first module, a second module, and a support portion according to still another embodiment.

FIG. 35 is a plan view of a first module, a second module, and a support portion according to still another embodiment.

Referring to FIG. 35, support portions 310 and 360_4 according to the present embodiment may include a first support portion 310 and a second support portion 360_4.

The second support portion 360_4 may include a convex pattern 350_3 having a predetermined width W5 in the second direction DR2 and a concave pattern 310_2 disposed between the convex pattern 350_3 and the second module 200 in a plan view. An end portion of the other side of the convex pattern 350_3 in the first direction DR1 may be directly connected to an end portion of one side of the concave pattern 310_2 in the first direction DR1.

Figure 36:
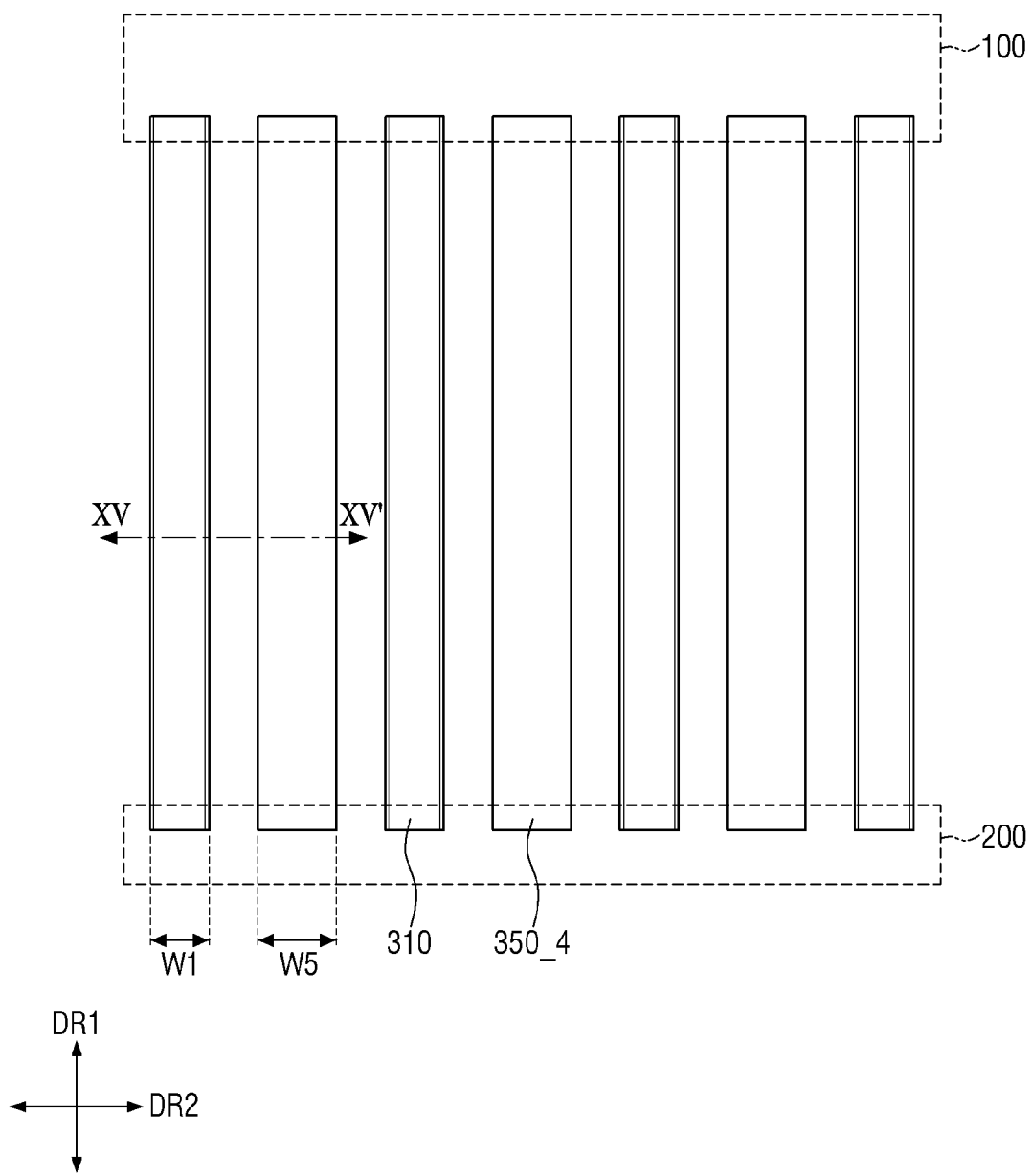
FIG. 36 is a plan view of a first module, a second module, and a support portion according to still another embodiment.
Figure 37:
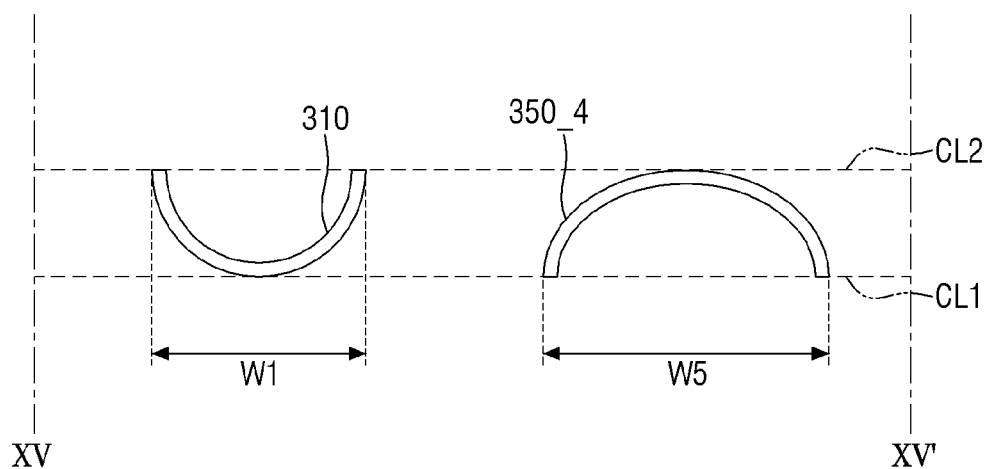
FIG. 37 is a cross-sectional view taken along line XV-XV' of FIG. 36.

FIG. 36 is a plan view of a first module, a second module, and a support portion according to still another embodiment. FIG. 37 is a cross-sectional view taken along line XV-XV' of FIG. 36.

Referring to FIGS. 36 and 37, the present embodiment is different from the embodiment of FIGS. 7 and 8 in that support portions 310 and 350_4 may include a first support portion 310 and a second support portion 350_4.

A predetermined width W5 of the second support portion 350_4 may be greater than a predetermined width W1 of the first support portion 310.

Figure 38:
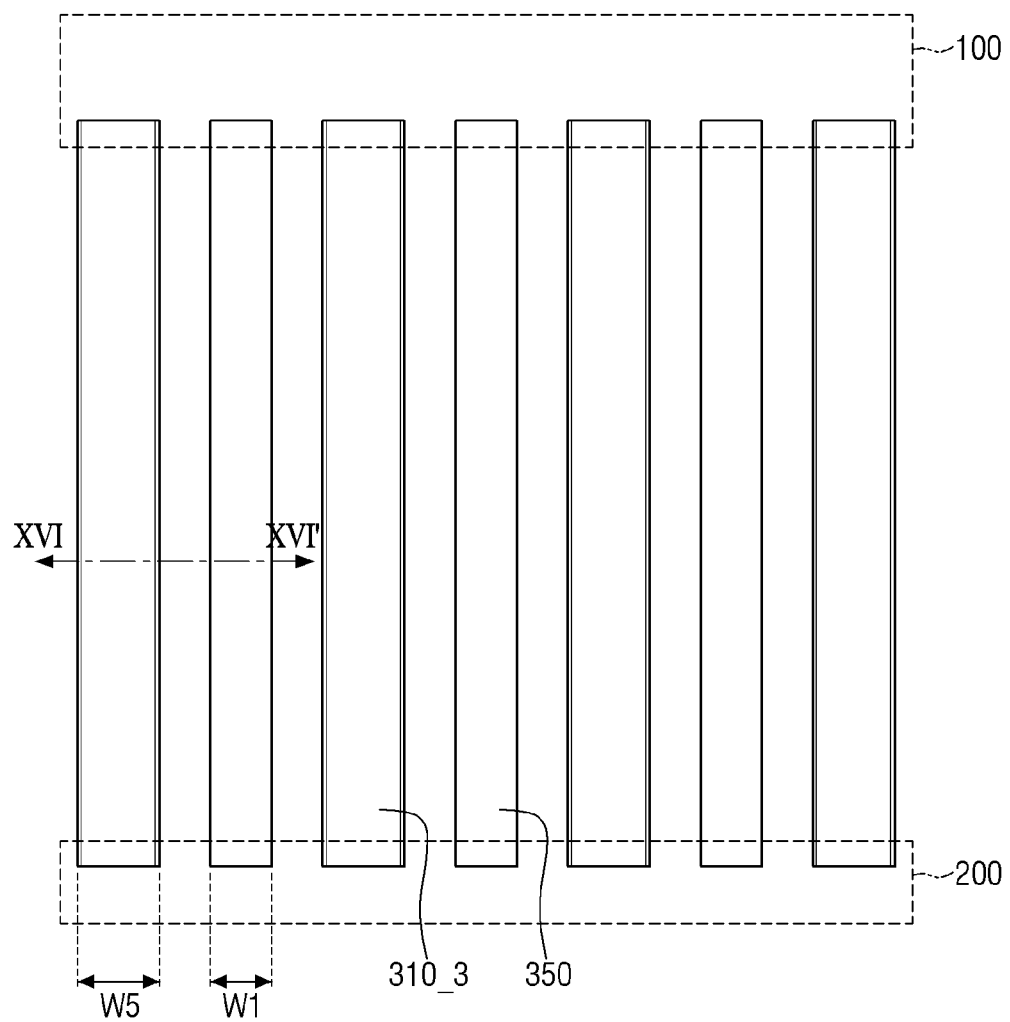
FIG. 38 is a plan view of a first module, a second module, and a support portion according to still another embodiment.
Figure 39:
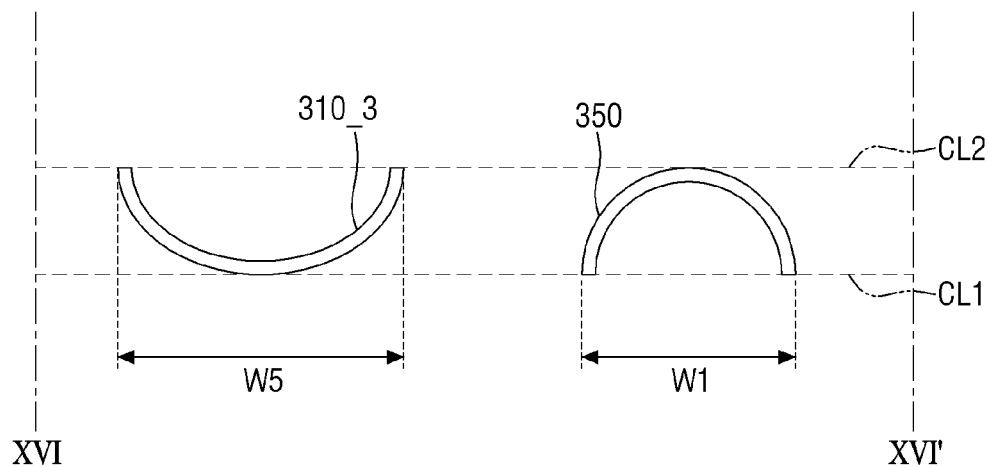
FIG. 39 is a cross-sectional view taken along line XVI-XVI' of FIG. 38.

FIG. 38 is a plan view of a first module, a second module, and a support portion according to still another embodiment. FIG. 39 is a cross-sectional view taken along line XVI-XVI' of FIG. 38.

Referring to FIGS. 38 and 39, the present embodiment is different from the embodiment of FIGS. 7 and 8 in that support portions 310_3 and 350 may include a first support portion 310_3 and a second support portion 350.

A predetermined width W5 of the first support portion 310_3 may be greater than a predetermined width W1 of the second support portion 350.

Figure 40:
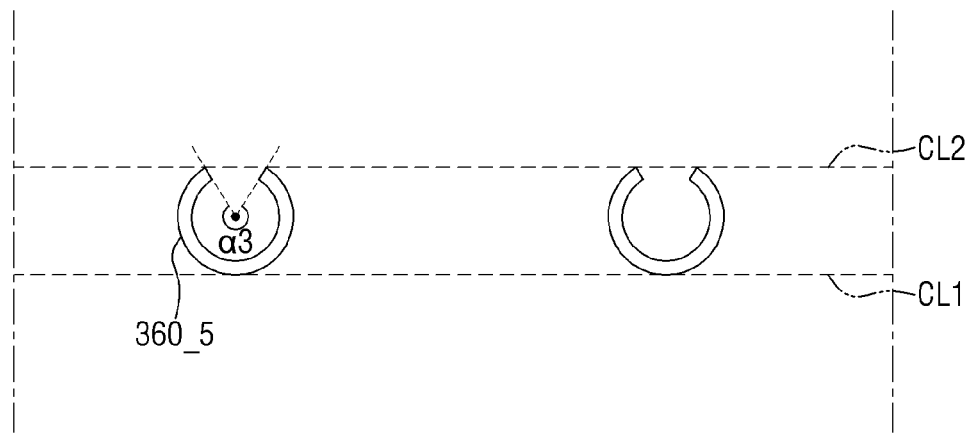
FIG. 40 is a cross-sectional view illustrating a first support portion and a second support portion according to still another embodiment.

FIG. 40 is a cross-sectional view illustrating a first support portion and a second support portion according to still another embodiment.

Referring to FIG. 40, the present embodiment is different from the embodiment of FIG. 8 in that each of first and second support portions 360_5 of the support portion of the display device according to the present embodiment has an arc shape, and a central angle α3 of the arc shape is greater than 180 degrees and smaller than 360 degrees.

More specifically, the first and second support portions 360_5 may have a concave pattern which is concave in an upward direction. In addition, each of the first and second support portions 360_5 may have an arc shape, and a central angle α3 of the arc shape may be greater than 180 degrees and smaller than 360 degrees. For example, the central angle α3 may be about 135 degrees.

According to the present embodiment, since the first and second support portion 360_5 have the concave pattern which is concave in the upward direction and have the arc shape, and the central angle α3 of the arc shape is greater than 180 degrees and smaller than 360 degrees, the first and second support portions 360_5 may have the support characteristics by the first support portion 310 of FIG. 8 and the support characteristics by the second support portion 350 at the same time.

Figure 41:
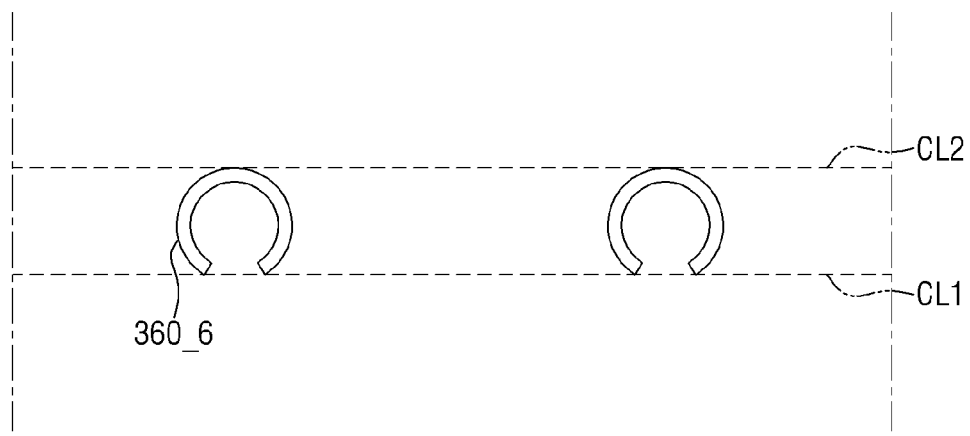
FIG. 41 is a cross-sectional view illustrating a first support portion and a second support portion according to still another embodiment.

FIG. 41 is a cross-sectional view illustrating a first support portion and a second support portion according to still another embodiment.

Referring to FIG. 41, the present embodiment is different from the embodiment of FIG. 40 in that first and second support portions 360_6 of the support portion of the display device according to the present embodiment have a convex pattern which is convex in an upward direction, respectively.

According to the present embodiment, since the first and second support portion 360_6 have the convex pattern which is convex in the upward direction and have an arc shape, and a central angle α3 of the arc shape is greater than 180 degrees and smaller than 360 degrees, the first and second support portions 360_6 may have the support characteristics by the first support portion 310 of FIG. 8 and the support characteristics by the second support portion 350 at the same time.

Figure 42:
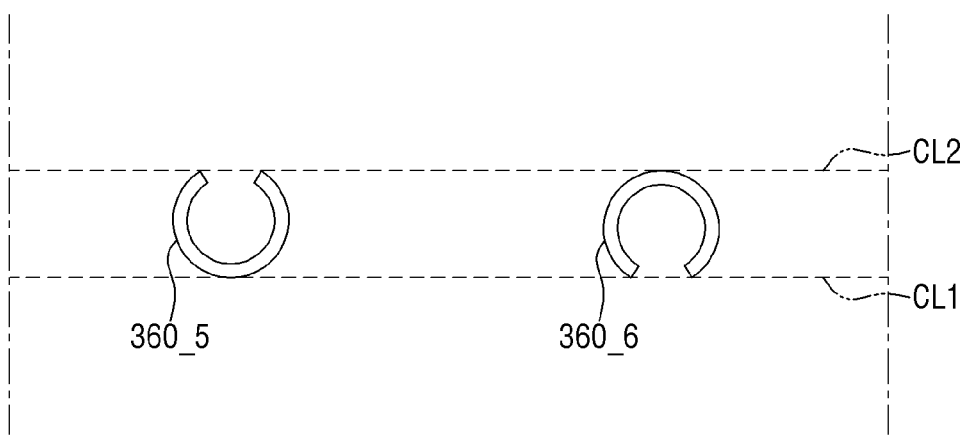
FIG. 42 is a cross-sectional view illustrating a first support portion and a second support portion according to still another embodiment.

FIG. 42 is a cross-sectional view illustrating a first support portion and a second support portion according to still another embodiment.

Referring to FIG. 42, the present embodiment is different from the embodiment of FIG. 40 in that support portions 360_5 and 360_6 according to the present embodiment have the first support portion 360_5 and the second support portion 360_6.

Since the first support portion 360_5 is described above with reference to FIG. 40 and the second support portion 360_6 is described above with reference to FIG. 41, the detailed descriptions thereof will be omitted.

Figure 43:
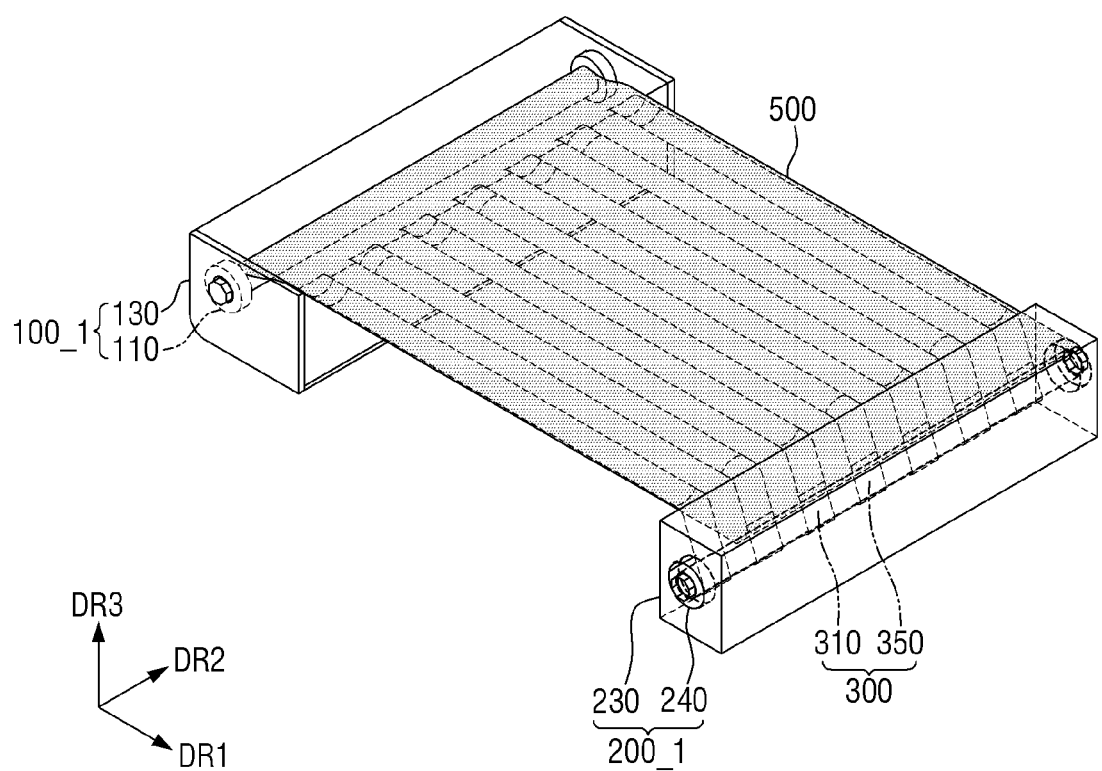
FIG. 43 is a perspective view of a display device according to still another embodiment.

FIG. 43 is a perspective view of a display device according to still another embodiment.

Referring to FIG. 43, a display device according to the present embodiment is different from the display device of FIG. 1 in that a first module 100_1 does not include the first roller portion (see 120 in FIG. 1) and a second module 200_1 includes a first roller portion 240.

The other end portion of the support portion 300 may be fixed to the first roller portion 240. Furthermore, one end portion of the support portion 300 may be fixed to the first housing 130. In the present embodiment, as illustrated in FIG. 43, the battery (210 in FIG. 1) and the frame (220 in FIG. 1) may be omitted. However, the present disclosure is not limited thereto, and the battery 210 and the frame 220 may also not be omitted. The second module 200_1 may move away from the first module 100_1 when the display panel 500 is unwound.

Since other descriptions have been described above, redundant descriptions will be omitted below.

Although embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A display device comprising:
   a first module including a first housing and a first roller portion disposed in the first housing;
   a plurality of support portions having first end portions fixed to the first roller portion in the first housing and extending in a first direction;
   a display panel disposed to overlap the plurality of support portions and including a first surface and a second surface opposite to the first surface; and
   a second module including a second housing to which second end portions of the plurality of support portions are fixed, wherein the second end portions are opposite to the first end portions,
   wherein the plurality of support portions is disposed on the second surface of the display panel,
   the plurality of support portions includes a first support portion, and a second support portion spaced apart from the first support portion in a second direction intersecting the first direction,
   the first support portion includes a concave pattern which is concave in a direction facing the second surface of the display panel, and
   the second support portion includes a convex pattern which is convex in the direction facing the second surface of the display panel.

2. The display device of claim 1, wherein the second module is movable to be close to or away from the first module in the first direction.

3. The display device of claim 2, wherein the plurality of support portions is wound around the first roller portion as the second module is close to the first module, and
   the plurality of support portions is unwound from the first roller portion as the second module moves away from the first module.

4. The display device of claim 3, wherein the first module further includes a second roller portion disposed in the first housing and spaced apart from the first roller portion.

5. The display device of claim 4, wherein a first end portion of the display panel is fixed to the second roller portion, and a second end portion of the display panel is fixed in the second housing, and the second end portion of the display panel is opposite to the first end portion of the display panel.

6. The display device of claim 5, wherein the display panel is wound around the second roller portion as the second module is close to the first module, and
   the display panel is unwound from the second roller portion as the second module moves away from the first module.

7. The display device of claim 6, wherein the second module further includes a battery disposed in the second housing.

8. The display device of claim 1, wherein the concave pattern and the convex pattern each have an arc shape, and the arc shape has a central angle greater than 90 degrees and smaller than 180 degrees.

9. The display device of claim 1, wherein each of the first support portion and the second support portion is provided in plural, and
the first support portions and the second support portions are alternately arranged along the second direction.

10. The display device of claim 1, wherein the first support portion further includes the convex pattern,
the second support portion further includes the concave pattern,
the convex pattern of the first support portion is disposed between the concave pattern of the first support portion and the display panel, and
the convex pattern of the second support portion is disposed between the concave pattern of the second support portion and the display panel.

11. The display device of claim 1, wherein the first support portion further includes first sub-support portions connected to opposite sides of the concave pattern in the second direction,
the second support portion further includes second sub-support portions connected to opposite sides of the convex pattern in the second direction, and
the first sub-support portions and the second sub-support portions are each flat.

12. The display device of claim 11, wherein the first support portion further includes the convex pattern,
the second support portion further includes the concave pattern,
the convex pattern of the first support portion is disposed between the concave pattern of the first support portion and the display panel,
the convex pattern of the second support portion is disposed between the concave pattern of the second support portion and the display panel,
the first support portion further includes third sub-support portions connected to opposite sides of the convex pattern of the first support portion in the second direction,
the second support portion further includes fourth sub-support portions connected to opposite sides of the concave pattern of the second support portion in the second direction,
the first sub-support portions and the third sub-support portions are in direct contact with each other, and
the second sub-support portions and the fourth sub-support portions are in direct contact with each other.

13. The display device of claim 1, wherein the first support portion further includes the convex pattern, and
the convex pattern of the first support portion is disposed between the first module and the concave pattern of the first support portion in a plan view.

14. The display device of claim 13, wherein the second support portion further includes the concave pattern, and
the convex pattern of the second support portion is disposed between the first module and the concave pattern of the second support portion in the plan view.

15. The display device of claim 13, wherein a width of the concave pattern of the first support portion in the second direction is greater than a width of the convex pattern of the first support portion in the second direction.

16. The display device of claim 1, wherein a width of the first support portion in the second direction is greater than a width of the second support portion in the second direction.

17. A display device comprising:
a first module including a first housing and a first roller portion disposed in the first housing, wherein a display panel is configured to be wound around the first roller portion or unwound from the first roller portion;
a second module including a second housing and a second roller portion disposed in the second housing, wherein the second module moves away from the first module when the display panel is unwound;
a plurality of support portions having first end portions fixed to the second roller portion and extending in a first direction and having second end portions fixed to the first housing; and
the display panel disposed to overlap the plurality of support portions and including a first surface and a second surface opposite to the first surface,
wherein the plurality of support portions is disposed on the second surface of the display panel,
the plurality of support portions includes a first support portion, and a second support portion spaced apart from the first support portion in a second direction intersecting the first direction,
the first support portion includes a concave pattern which is concave in a direction facing the second surface of the display panel, and
the second support portion includes a convex pattern which is convex in the direction facing the second surface of the display panel.

18. The display device of claim 17, wherein the second module is movable to be close to or away from the first module in the first direction,
the plurality of support portions is wound around the second roller portion as the second module is close to the first module, and
the plurality of support portions is unwound from the second roller portion as the second module moves away from the first module.

19. The display device of claim 18, wherein a first end portion of the display panel is fixed to the first roller portion, and a second end portion of the display panel is fixed in the second housing, and the second end portion of the display panel is opposite to the first end portion of the display panel.

20. The display device of claim 19, wherein the display panel is wound around the first roller portion as the second module is close to the first module, and
the display panel is unwound from the first roller portion as the second module moves away from the first module.

* * * * *